United States Patent
Suzuki

(10) Patent No.: US 10,224,176 B2
(45) Date of Patent: Mar. 5, 2019

(54) ELECTRON MICROSCOPE AND METHOD OF OPERATING SAME

(71) Applicant: JEOL Ltd., Tokyo (JP)

(72) Inventor: Takashi Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/662,576

(22) Filed: Jul. 28, 2017

(65) Prior Publication Data

US 2018/0130635 A1    May 10, 2018

(30) Foreign Application Priority Data

Jul. 29, 2016 (JP) ................. 2016-150008

(51) Int. Cl.
| | |
|---|---|
| H01J 37/24 | (2006.01) |
| H01J 37/073 | (2006.01) |
| H01J 37/22 | (2006.01) |
| H01J 37/244 | (2006.01) |
| H01J 37/28 | (2006.01) |

(52) U.S. Cl.
CPC ............ *H01J 37/24* (2013.01); *H01J 37/073* (2013.01); *H01J 37/222* (2013.01); *H01J 37/244* (2013.01); *H01J 37/28* (2013.01); *H01J 2237/0653* (2013.01); *H01J 2237/06341* (2013.01); *H01J 2237/221* (2013.01); *H01J 2237/245* (2013.01); *H01J 2237/2487* (2013.01); *H01J 2237/24495* (2013.01); *H01J 2237/24535* (2013.01)

(58) Field of Classification Search
USPC ........................... 250/310, 306, 307
See application file for complete search history.

(56) References Cited

U.S. PATENT DOCUMENTS

| | | | | |
|---|---|---|---|---|
| 4,829,240 A | * | 5/1989 | Kitaoka | G01R 31/305 324/754.22 |
| 2013/0332116 A1 | * | 12/2013 | Suzuki | G06F 17/18 702/191 |

FOREIGN PATENT DOCUMENTS

JP        2013258030 A      12/2013

* cited by examiner

*Primary Examiner* — Kiet T Nguyen
(74) *Attorney, Agent, or Firm* — The Webb Law Firm

(57) ABSTRACT

There is provided an electron microscope capable of producing good images by reducing contrast nonuniformity. The electron microscope (1) includes: an electron beam source (11) for producing an electron beam; a noise cancelling aperture (12) and an amplifier (42) for detecting a part of the electron beam; an effective value computing circuit (44) and a low frequency cut-off circuit (46) for extracting a DC component of an effective value of a detection signal emanating from the amplifier (42); an image detector (15) for detecting a signal produced in response to impingement of the beam on a sample (A); a preamplifier circuit (20) and an amplifier circuit (30); a divider circuit (54) for performing a division of the output signal (X) from the amplifier circuit (30) by the output signal (Y) from the amplifier circuit (42) and producing a quotient signal indicative of the result of the decision (X/Y); and a multiplier circuit (58) for multiplying the quotient signal by a signal (Z) extracted by the low frequency cut-off circuit (46).

4 Claims, 22 Drawing Sheets

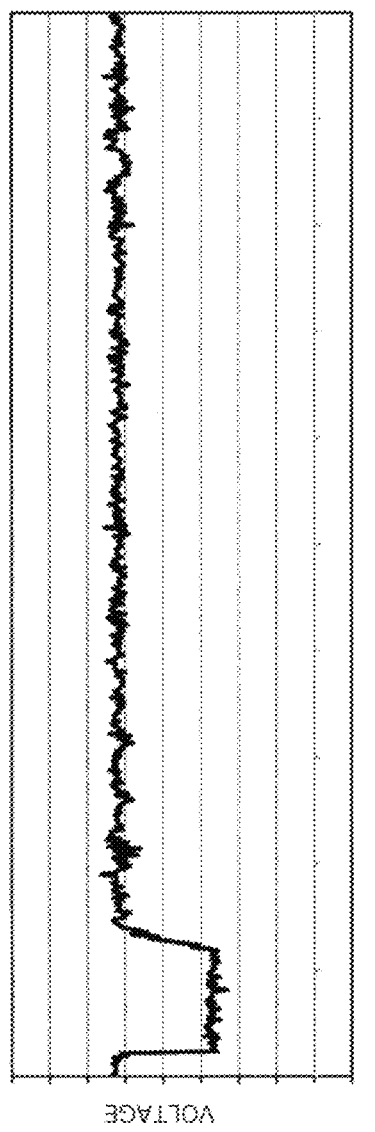

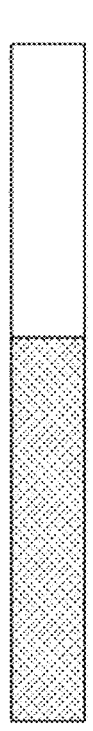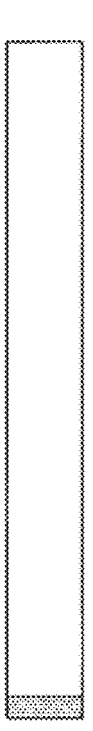

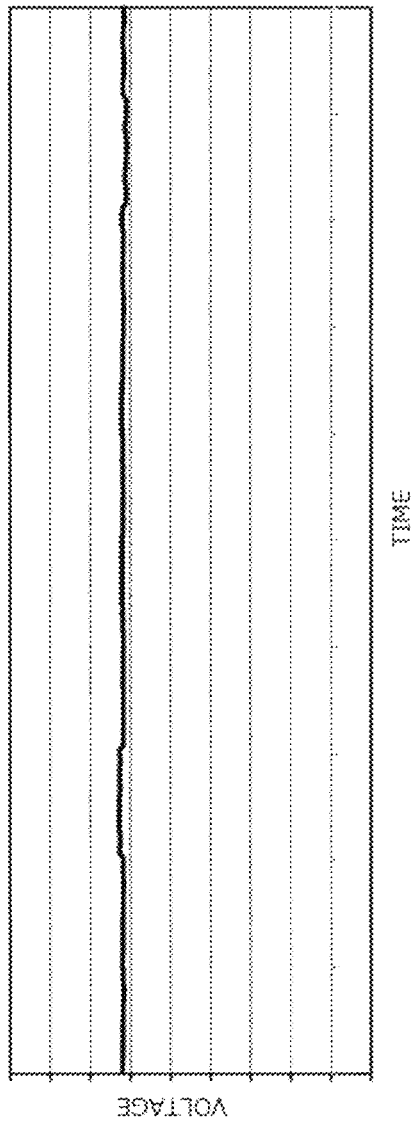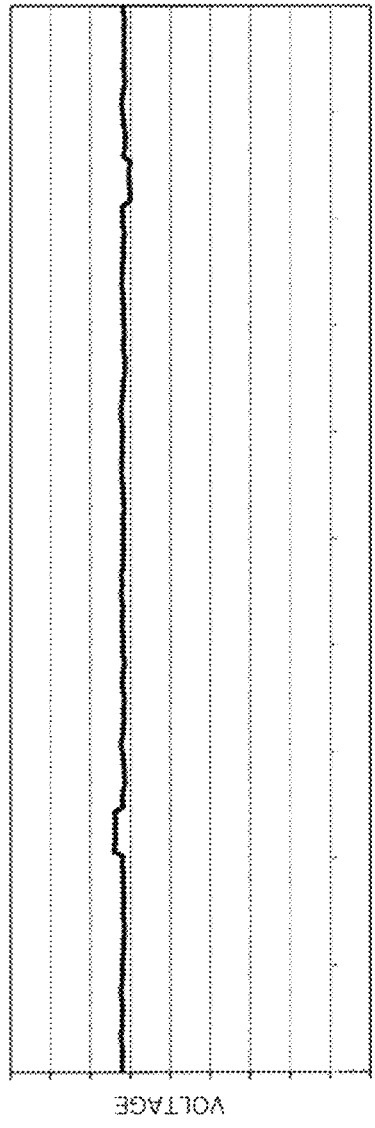

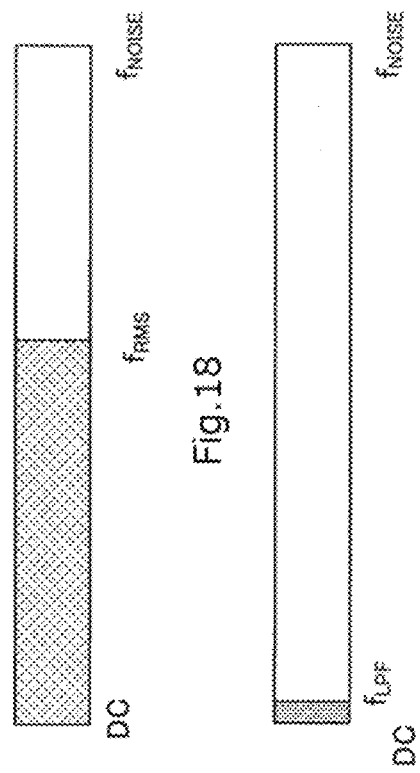

ELECTRON MICROSCOPE AND METHOD OF OPERATING SAME

BACKGROUND OF THE INVENTION

Field of the Invention

The present invention relates to an electron microscope and also to a method of operating it.

Description of Related Art

Generally, electrons emitted from a field emission electron gun contain a fluctuating portion of several percent for the following reasons. Gas is adsorbed on the emitter surface. Adsorbed gas molecules and ions migrate and so the work function of the metal surface varies. Also, collision of ions and molecules varies the topography of the metal surface. Therefore, where a scanning transmission electron microscope (STEM) equipped with a field emission electron gun is used, emission noise on the image has been eliminated by installing a noise-canceling detector in the electron optical column, detecting nearby electrons forming a probe so as to produce a detection signal, and dividing a signal arising from the sample by the detection signal. Such a noise cancellation technique is disclosed, for example, in JP-A-2013-258030.

FIG. 21 shows the configuration of a scanning transmission electron microscope (STEM) 101 having a general noise cancellation function. The electron microscope 101 of the example of FIG. 21 has an electron optical column 110 in which various components including a cold field-emission electron gun (CFEG) 111, a noise cancelling aperture 112, a lens 113a, scan coils 113b, another lens 114, a detector 115, a preamplifier circuit 120, and an amplifier circuit 130 are accommodated.

An electron beam emitted from the CFEG 111 is partially cut off by the noise cancelling aperture 112 and then focused onto a sample A by the lens 113a. The focused beam is scanned over the sample A by the scan coils 113b. The electron beam transmitted through the sample A passes through the lens 114 and is partially detected by the detector 115.

An image signal produced in response to detection by the detector 115 is the product of an emission current I1 impinging on the sample A and the luminance component S of the sample A, i.e., I1×S. There is a proportional relationship between the emission current I1 impinging on the sample A and the emission current I2 detected by the noise cancelling aperture 112 (i.e., I1=n×I2). An offset is added to the image signal, I1×S, and then amplified by a factor of Gp by the preamplifier circuit 120. The signal is further amplified by a factor of Ga by the amplifier circuit 130.

On the other hand, the emission current I2 detected by the noise cancelling aperture 112 is amplified by the factor of Gn by a noise detection circuit 140. When the noise cancellation function is not used, the output signal from the amplifier circuit 130 is made to bypass a noise cancelling circuit 150 and arithmetically processed in a given manner by an arithmetic section (CPU) 160. Then, the resulting signal is sent to a personal computer (PC) 102 having a display screen. Finally, an STEM image of the sample A is displayed on the display screen.

When the noise cancellation function is used, the output signal from the amplifier circuit 130 is divided by the output signal of the noise detection circuit 140 after the offset component added by the preamplifier circuit 120 is subtracted in the noise cancelling circuit 150. Consequently, the emission noise contained in the image signal is removed. The image signal free from the emission noise is arithmetically processed in a given manner by the arithmetic section (CPU) 160. Then, the resulting signal is sent to the personal computer (PC) 102, and the STEM image of the sample A free from the emission noise is displayed on the display screen of the PC 102.

FIG. 22 shows one example of the specific configuration of signal processing circuitry used when the noise cancellation function is not in use. As shown in this FIG. 22, when the noise cancellation function is not in use, STEM imaging fundamentally relies on adjustments of only two operating parameters, i.e., contrast and brightness. The "contrast" is a gain added to the image signal to adjust the brightness level. The "brightness" is a DC voltage added to cancel the offset component of the image signal. In the example of FIG. 22, brightness B is added to the image signal, I1×S, by an adder 122 included in the preamplifier circuit 120, the image signal being derived from the detector 115 while adjusting the contrast. Then, the output signal from the preamplifier circuit 120 is amplified by a factor of Gp by an amplifier 124. Consequently, the output signal $V_{11}$ from the amplifier 124 is given by $$V_{11} = Gp \times (S \times I1 + B) \quad \text{(A)}$$

The output signal $V_{11}$ from the amplifier 124 is amplified by a factor of Ga by an amplifier 132 included in the amplifier circuit 130. Using Eq. (A) above, the output signal $V_{12}$ from the amplifier 132 is given by $$V_{12} = Ga \times Gp \times (S \times I1 + B) \quad \text{(B)}$$

The output signal $V_{12}$ from the amplifier 132 is analog-to-digital converted by an A/D converter 162 and then arithmetically processed (e.g., averaged) in the arithmetic section 160. The result is sent to the PC 102 shown in FIG. 21.

On the other hand, FIG. 23 shows one example of the specific configuration of the signal processing circuitry when the noise cancellation function is used. As shown in this FIG. 23, when the noise cancellation function is used, the output signal $V_{12}$ from the amplifier 132 is also represented by Eq. (B) above. In order to cancel out the brightness B added by the preamplifier circuit 120, the noise cancelling circuit 150 operates such that a gain equal to the product of the gain Gp of the amplifier 124 and the gain Ga of the amplifier 132 is given to the brightness B using an amplifier 151. This is subtracted from the output signal $V_{12}$ from the amplifier 132 by a subtractor 152. Thus, using Eq. (B), the output signal $V_{13}$ from the subtractor 152 is given by $$V_{13} = Ga \times Gp \times (S \times I1 + B) - Ga \times Gp \times B \quad \text{(C)}$$
$$= Ga \times Gp \times S \times I1$$

The emission current I2 detected by the noise cancelling aperture 112 is converted into a voltage and amplified by a factor of Gn by an amplifier 142 in the noise detection circuit 140. Accordingly, the output signal $V_{14}$ from the amplifier 142 is given by $$V_{14} = Gn \times I2 \quad \text{(D)}$$

The output signal $V_{13}$ from the subtractor 152 is applied to the numerator input (X) of a divider circuit 154. The output signal $V_{14}$ from the amplifier 142 is applied to the denominator input (Y) of the divider circuit 154. Therefore, using Eqs. (C) and (D), the output signal $V_{15}$ from the divider circuit 154 is given by $$V_{15} = \frac{X}{Y} = \frac{V_{13}}{V_{14}} = \frac{Ga \times Gp \times S \times I1}{Gn \times I2} \quad (E)$$

The output signal from the subtractor 152 is subtracted from the output signal $V_{12}$ from the amplifier 132. For this purpose, the noise cancelling circuit 150 gives a gain equal to the product of the gain Gp of the amplifier 124 and the gain Ga of the amplifier 132 to the brightness B by an amplifier 155, and adds the output signal from the amplifier 155 to the output signal $V_{15}$ from the divider circuit 154 by an adder 156. Thus, the output signal $V_{16}$ from the adder 156 is given by $$V_{16} = \frac{Ga \times Gp \times S \times I1}{Gn \times I2} + Ga \times Gp \times B \quad (F)$$
$$= S \times \frac{Ga \times Gp}{Gn} \times \frac{I1}{I2} + Ga \times Gp \times B$$

The output signal $V_{16}$ from the adder 156 is analog-to-digital converted by the A/D converter 162 in the arithmetic section 160, then arithmetically processed (e.g., averaged), and sent to the PC 102 shown in FIG. 21.

Substituting I1=n×I2 into Eq. (F) gives rise to:

$$V_{16} = S \times \frac{Ga \times Gp}{Gn} \times n + Ga \times Gp \times B \quad (G)$$

Note that I1 and I2 containing emission noise are not present in the right side of Eq. (G). Consequently, if the noise cancellation function is used, values proportional to the luminance component S of the sample A to be imaged are obtained in the same way as when there is no emission noise.

In the example of FIG. 23, processing steps such as removal and readdition of brightness and division are performed with analog circuitry. Alternatively, these processing steps may be performed by digital arithmetic operations, in which case adjustments of measurements or settings of the gain of the brightness which is removed and readded can be performed automatically.

Where the above Eq. (G) is used, the gain of the STEM signal processing system varies depending on whether or not the noise cancellation function is used. Therefore, in the technique of JP-A-2013-258030, the gain of the STEM signal processing system is maintained constant whether or not the noise cancellation function is used, by multiplying the gain of the STEM signal processing system by the effective value of the noise signal responsive to detected emission noise.

Let $V_{RMS}$ be the effective value of the noise signal. The effective value $V_{RMS}$ is approximated by $$V_{RMS} \approx (I2 \times G_n)_{RMS} = G_n \times I2_{RMS} \quad (H)$$

where $I2_{RMS}$ is the effective value of the emission current I2. As a result, Eq. (G) is given by the following Eq. (I):

$$\frac{S \times I1 \times Gp \times Ga}{I2 \times Gn} \times V_{RMS} \approx S \times Gp \times Ga \times \left(\frac{I1 \times I2_{RMS}}{I2}\right) \quad (I)$$

where the term of the brightness is omitted for the sake of convenience.

In Eq. (I), the emission currents I1 and I2 are rewritten as follows:

$$I1 = I1_{DC} + I1_{AC}$$

$$I2 = I2_{DC} + I2_{AC}$$

where $I1_{DC}$ is an ideal DC current obtained by removing the noise component $I1_{AC}$ from the emission current I1. $I1_{AC}$ is the noise component of the emission current I1. $I2_{DC}$ is an ideal DC current obtained by removing the noise component $I2_{AC}$ from the emission current I2. $I2_{AC}$ is the noise component of the emission current I2.

The effective value $I2_{RMS}$ of the emission current is substantially equal to the emission current I2 occurring when the noise component $I2_{AC}$ has been removed. That is, $$I2_{RMS} \approx I2_{DC}$$

Under this condition, Eq. (I) is approximated as follows:

$$S \times Gp \times Ga \times \left(\frac{I1 \times I2_{RMS}}{I2}\right) \approx S \times Gp \times Ga \times I1_{DC}$$

Accordingly, with the technique of JP-A-2013-258030, the emission noise can be removed from the image signal while maintaining the gain of the STEM signal processing system, i.e., without varying the fixed values of the gains Ga and Gp.

The conventional noise cancellation method described so far has the following problems. Where noise of large amplitude enters a noise signal, the effects of the noise can be removed by the divider circuit 154 in the case of the signal processing circuitry shown in FIG. 23. However, in the technique of JP-A-2013-258030, the quotient or result of division performed by the divider circuit 154 is multiplied by the effective value of the noise signal as described previously. Consequently, the result of computation of the effective value is subject to the effects of the noise. This produces nonuniform contrast in the STEM image. This will be further described by referring to some figures.

FIG. 24 is a diagram illustrating one example of noise signal occurring when there are no noises having large amplitudes. FIG. 25 shows a computed effective value of the noise signal of FIG. 24. FIG. 26 is a diagram illustrating one example of noise signal arising when there are noises having large amplitudes. FIG. 27 shows a computed effective value of the noise signal of FIG. 26. FIG. 28 is a diagram obtained by enlarging parts of FIGS. 25 and 27 and superimposing them one above the other. FIG. 29 is a diagram schematically showing an STEM image $I_{STEM}$ from which emission noise has been removed by the use of the computed effective value (FIG. 27) of the noise signal shown in FIG. 26.

A circuit for computing the effective value of a noise signal is affected by noises having large amplitudes within a given time corresponding to a computation time (i.e., circuit constants) and thus the voltage difference with the effective value arising when the noises are not contained is greater as shown in FIG. 28. As a result, it is seen that contrast nonuniformity M in the form of a fringe pattern appears in the STEM image $I_{STEM}$ as shown in FIG. 29. Hence, a good electron microscope image may not be obtained.

SUMMARY OF THE INVENTION

The present invention has been made in view of the foregoing problem. One object associated with some aspects of the present invention is to provide an electron microscope capable of reducing contrast nonuniformity and obtaining good electron microscope images. Another object is to provide a method of operating this electron microscope.

(1) An electron microscope associated with the present invention includes: an electron beam source for producing an electron beam; an electron beam detector for detecting a part of the electron beam; a DC component extractor for extracting a DC component of an effective value of a detection signal emanating from the electron beam detector; an image detector for detecting a signal produced in response to impingement of the electron beam on a sample; and an arithmetic section for performing division on an image signal emanating from the image detector and a detection signal emanating from the electron beam detector and multiplication between a quotient signal indicative of the result of the division and the signal extracted by the DC component extractor.

The signal produced in response to impingement of the electron beam on the sample may be based, for example, on the electron beam transmitted through the sample or on electrons emitted from the sample in response to the impingement of the beam on the sample.

In this electron microscope, the ratio of the magnitude of the electron beam detected by the electron beam detector to the magnitude of the signal produced in response to impingement of the electron beam on the sample varies according to various settings of the illumination system, imaging system, and detection system and, accordingly, the DC component of the quotient (result of division) varies. It is possible to correct for this variation by multiplying a quotient signal indicative of the quotient by the DC component of the effective value of the detection signal (noise signal) derived from the electron beam detector.

In this electron microscope, when noise of large amplitude enters the detection signal (noise signal) emanating from the electron beam detector, the effective value of the detection signal from the electron beam detector is affected by the noise for a certain time corresponding to the time taken to compute the effective value, but the effects of the noise can be reduced or removed by extracting the DC component of the effective value. Therefore, in this electron microscope, when noise of large amplitude enters the detection signal arising from the electron beam detector, good electron microscope images of reduced contrast nonuniformity can be obtained by reducing the effects of the noise contained in the effective value of the detection signal from the electron beam detector.

(2) In one feature of the electron microscope of (1) above, the DC component extractor may have: an effective value computing section for computing the effective value; an AC component extractor for extracting an AC component of a signal indicative of the computed effective value; and a subtractor for performing a subtraction between the signal indicative of the computed effective value and the signal extracted by the AC component extractor.

In this electron microscope, the DC component of the effective value can be extracted by removing the AC component from the output signal of the effective value computing section which indicates the computed effective value.

(3) In another feature of the electron microscope of (2) above, there may be further included a processing section. The AC component extractor may have: a capacitor to which a signal indicative of the computed effective value is applied; a first resistor; a second resistor having a smaller resistance value than the first resistor; and switching means for switching a resistor, which is connected with the capacitor and forms a high pass filter, between the first resistor and the second resistor. When a given operation of the electron microscope is detected, the processing section may perform an operation to control the switching means such that the resistor connected with the capacitor is switched from the first resistor to the second resistor. At the instant when a given time has passed since the switching from the first resistor to the second resistor, the processing section performs an operation to control the switching means such that the resistor connected with the capacitor is switched back to the first resistor from the second resistor.

In this electron microscope, as described later, when a given operation in which the potential of the detection signal (noise signal) from the electron beam detector varies greatly is performed, the time from the instant when this operation is started until the DC component extractor first provides an output signal can be shortened.

(4) In one feature of the electron microscope of any one of (1)-(2) above, there may be further included a processing section for performing operations of the DC component extractor and of the arithmetic section by digital computations.

(5) In one feature of the electron microscope of (4) above, the processing section may extract the DC component of the effective value by computing an average value of the effective value.

(6) In one feature of the electron microscope of (5) above, the processing section may initiate the operation of computing the average value of the effective value when a given operation of the electron microscope is detected, cause an average value of n data elements to be taken as the DC component of the effective value when the number of data elements n about the effective value is smaller than a target value N, and cause an average value of N data elements to be taken as the DC component of the effective value when the number of data elements n about the effective value is equal to or greater than the target value N.

In this electron microscope, as described later, when a given operation in which the potential of the detection signal (noise signal) from the electron beam detector varies greatly is performed, the time from the instant when this operation is started until the DC component extractor first provides an output signal can be shortened.

(7) A method according to the present invention is implemented to operate an electron microscope having an electron beam source for producing an electron beam and involves the steps of: detecting a part of the electron beam to thereby produce a detection signal; extracting a DC component of an effective value of the detection signal; detecting a signal produced in response to impingement of the electron beam on a sample to thereby produce an image signal; performing a division on the image signal and the detection signal and producing a quotient signal indicative of the result of the division; and performing multiplication between the quotient signal and the extracted signal.

In this method of operating an electron microscope, the ratio of the magnitude of the detected electron beam to the magnitude of the image signal varies according to various settings of the illumination system, imaging system, and detection system of the microscope and thus the DC component of the quotient signal varies. However, it is possible to correct for the variations by multiplying the quotient signal by the DC component of the effective value of the detected part of the electron beam (noise signal).

Furthermore, in this method of operating an electron microscope, when noise of large amplitude enters the detection signal (noise signal), the effective value of the detection signal is affected by the noise for a certain time corresponding to the time taken to compute the effective value. However, the effects of the noise can be reduced or removed by extracting the DC component of the effective value. Therefore, in this method of operating an electron microscope, when noise of large amplitude enters the detection signal, the effects of the noise contained in the effective value of the detection signal are reduced and thus good electron microscope images of reduced contrast nonuniformity can be obtained.

BRIEF DESCRIPTION OF THE DRAWINGS

FIG. 9 is a diagram showing another example of noise signal.

FIG. 10 is a diagram showing one example of bandwidth of a prior art effective value computing circuit pertinent to the present disclosure.

FIG. 11 is a diagram showing one example of bandwidth of an effective value computing circuit included in the signal processing circuitry of FIG. 2.

FIG. 12 is a diagram showing one example of the bandwidth of an AC component extractor circuit included in the low frequency cut-off circuit of FIG. 4.

FIG. 13 is a diagram showing one example of the bandwidth of the low frequency cut-off circuit shown in FIG. 2 after the noise component has been removed.

FIG. 14 is a diagram showing one example of effective value computed by a conventional effective value computing circuit in a case where the computation time is long.

FIG. 15 is a diagram showing one example of effective value computed by the conventional effective value computing circuit in a case where the computation time is short.

FIG. 18 is a diagram showing one example of bandwidth of an effective value.

FIG. 19 is a diagram showing one example of bandwidth of an average value of an effective value obtained using a digital filter.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

Figure 1:
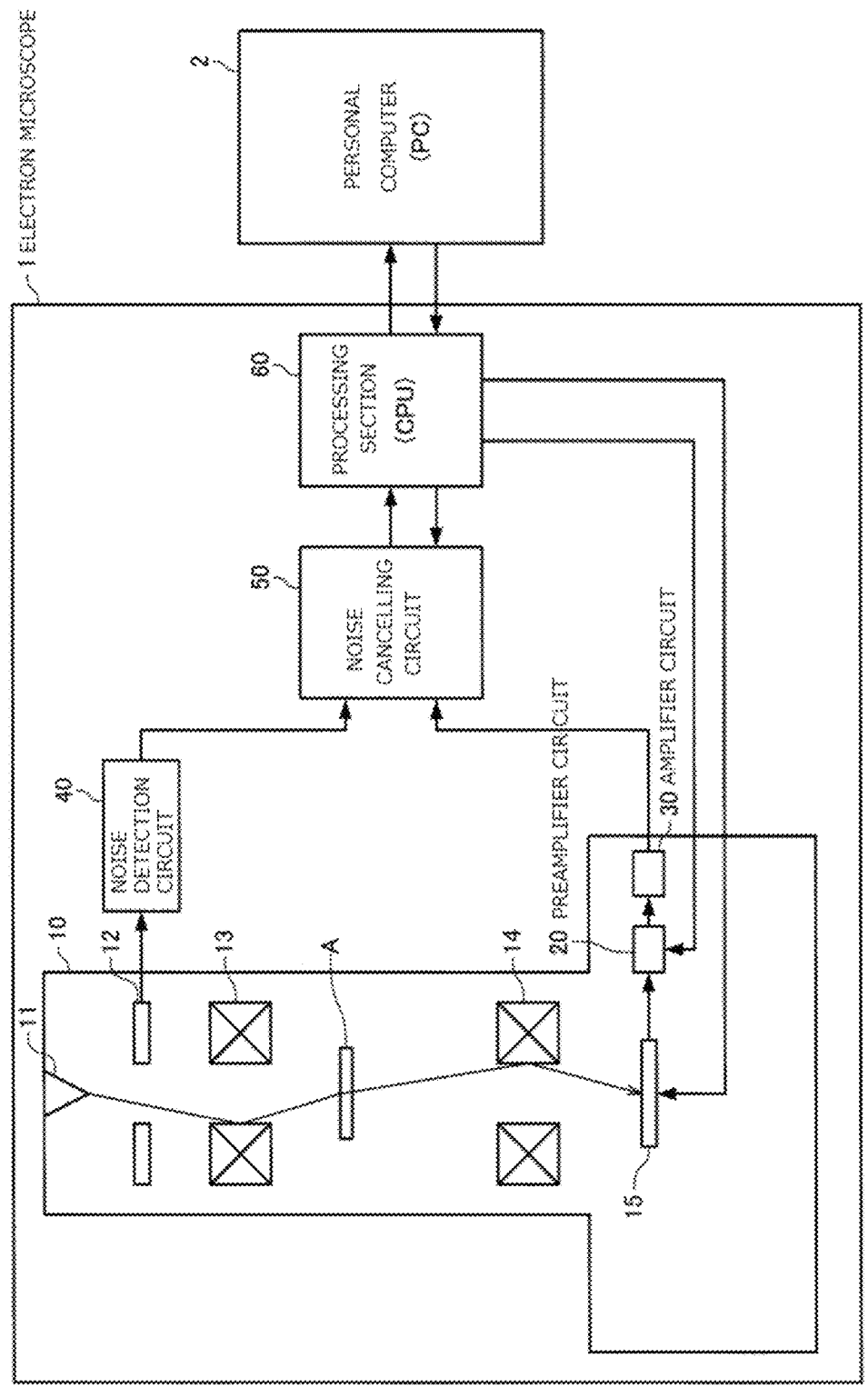
FIG. 1 is a block diagram showing one example of the configuration of an electron microscope according to a first embodiment of the present invention.

FIG. 1 is a diagram showing one example of configuration of an electron microscope according to a first embodiment of the present invention. As shown in FIG. 1, this electron microscope, generally indicated by reference numeral 1, is configured including an electron optical column 10, a noise detection circuit 40, a noise cancelling circuit 50, and a processing section (CPU) 60. The electron optical column 10 incorporates various components such as an electron beam source 11, a noise cancelling aperture 12, lenses 13, 14, an image detector 15, a preamplifier circuit 20, and an amplifier circuit 30, as well as other various kinds of lenses and apertures which are not shown. The electron microscope 1 is a scanning transmission electron microscope (STEM). In the electron microscope 1 of the present embodiment, some of the constituent components shown in FIG. 1 may be omitted or modified in configuration or new constituent components may be added.

The electron beam source 11 produces an electron beam which is partially cut off by the noise cancelling aperture 12 and then focused onto a sample A by the lens 13. For example, a well-known electron gun such as a cold field-emission gun (CFEG) can be used as the electron beam source 11.

The electron beam enters the sample A and passes through it. The beam then passes through the lens 14, and a part of the beam is detected by the image detector 15. As a result, the image detector 15 provides an image signal which is the product of the emission current I1 impinging on the sample A and the luminance component S of the sample A, i.e., I1×S.

The noise cancelling aperture 12 detects the emission current (noise signal). For example, in the electron optical column 10, any one of apertures of the illumination system disposed between the electron beam source 11 and the sample A (such as a condenser lens aperture) may be used also as the noise cancelling aperture 12. Aside from the apertures of the illumination system, a dedicated noise cancelling aperture 12 may be mounted. An emission current I2 detected by the noise cancelling aperture 12 is amplified by the noise detection circuit 40.

The noise cancelling circuit 50 removes (more correctly, reduces) the noise signal superimposed on the output signal from the amplifier circuit 30 by making use of the fact that there is a proportional relationship (I1=n×I2) between the emission current I1 impinging on the sample A and the emission current I2 detected by the noise cancelling aperture 12. The signal from which the noise signal has been removed is arithmetically processed in a given manner by the processing section 60 and then sent to the personal computer (PC) 2, where an STEM image of the sample A is displayed on its display and stored.

Figure 2:
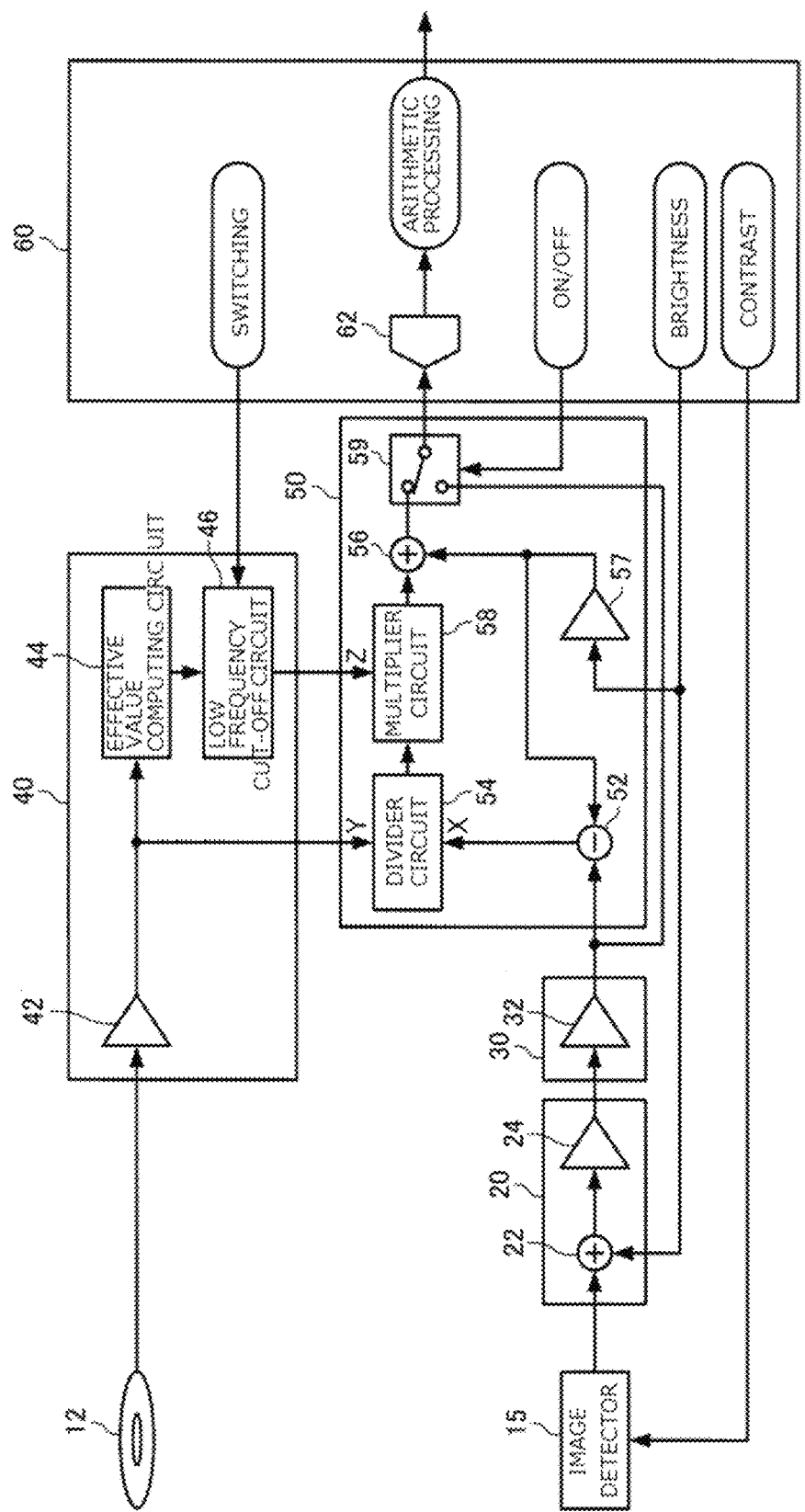
FIG. 2 is a block diagram showing one example of the specific configuration of signal processing circuitry included in the electron microscope shown in FIG. 1.
Figure 3:
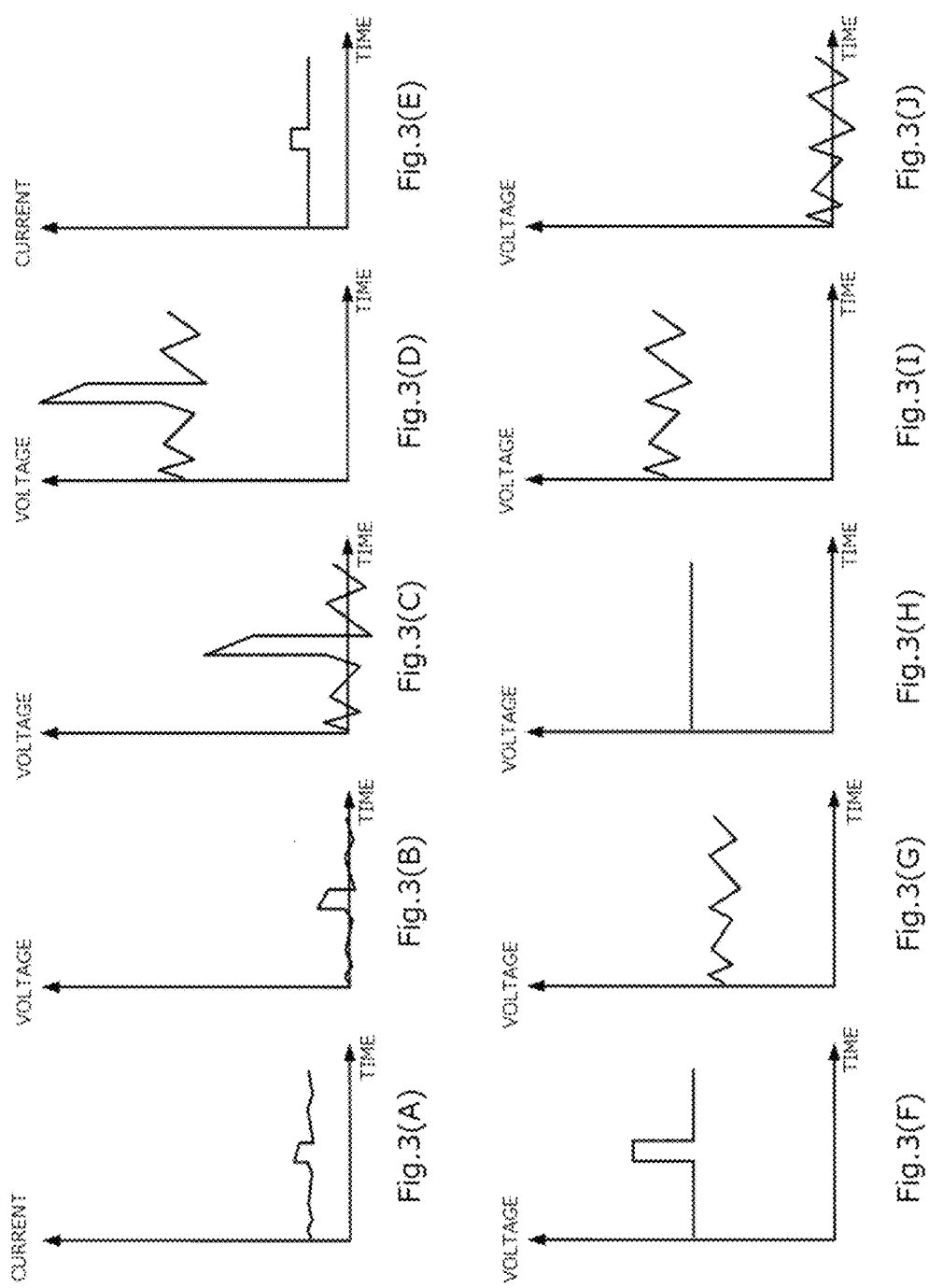
FIGS. 3(A)-3(J) are diagrams showing examples of signal waveforms at nodes in the signal processing circuitry of FIG. 2.

FIG. 2 shows an example of specific configuration of the signal processing circuitry of the present embodiment. In FIG. 2, those components of the circuitry which are identical in configuration to their counterparts of FIG. 1 are indicated by the same reference numerals as in FIG. 1. FIGS. 3(A)-3(J) show examples of signal waveform at various nodes in the circuitry of FIG. 2.

As shown in FIG. 2, in the present embodiment, the processing section 60 can activate and deactivate the noise cancellation function by switching a switch circuit 59 on or off under control from the PC 2 shown in FIG. 1.

When the noise cancellation function is inactive, the output signal from the amplifier circuit 30 is applied to the processing section 60 via the switch circuit 59. Accordingly, where the noise cancellation function is inactive, STEM imaging is done with adjustments of fundamentally only two operating parameters, i.e., contrast and brightness. The contrast is a gain applied to the image signal to adjust the brightness level. In the present embodiment, contrast is established for the image detector 15. The brightness is a DC voltage applied to cancel out the offset component of the image signal. In the present embodiment, brightness is established for the preamplifier circuit 20.

In the present embodiment, the preamplifier circuit 20 is configured including an adder 22 and an amplifier 24. The image signal, S×I1 (see FIG. 3A), is obtained from the image detector 15 while adjusting the contrast. Brightness B is added to the image signal, S×I1, by the adder 22 and then the signal is amplified by a factor of Gp by the amplifier 24. Accordingly, the output signal $V_1$ (see FIG. 3B) from the amplifier 24 (output signal from the preamplifier circuit 20) is given by $$V_1 = Gp \times (S \times I1 + B) \tag{1}$$

In the present embodiment, the amplifier circuit 30 is configured including an amplifier 32. The output signal $V_1$ from the preamplifier circuit 20 is amplified by a factor of Ga by the amplifier 32. Therefore, using Eq. (1), the output signal $V_2$ (see FIG. 3C) from the amplifier 32 (output signal from the amplifier circuit 30) is given by $$V_2 = Ga \times Gp \times (S \times I1 + B) \tag{2}$$

The processing section 60 performs an analog-to-digital conversion of the output signal from the amplifier circuit 30 by an A/D converter 62, then arithmetically processes the resulting signal (e.g., averages it), generates image data, and sends the data to the PC 2 shown in FIG. 1. The processing section 60 can be implemented, for example, by a microcomputer. The PC 2 receives the image data generated by the processing section 60, writes the data into a frame buffer, displays an image of the sample A on its display, and stores or otherwise processes the data.

On the other hand, when the noise cancellation function is active, the output signal $V_2$ from the amplifier circuit 30 is noise-canceled by the noise cancelling circuit 50 and then applied to the processing section 60 via the switch circuit 59.

In the present embodiment, the noise cancelling circuit 50 is configured including a subtractor 52, a divider circuit 54, an adder 56, an amplifier 57, a multiplier circuit 58, and the switch circuit 59. The amplifier 57 gives a gain, Gp×Ga, equal to the product of the gain Gp of the amplifier 24 and the gain Ga of the amplifier 32 to the brightness B. The subtractor 52 subtracts the output signal (Gp×Ga×B) of the amplifier 57 from the output signal $V_2$ of the amplifier circuit 30. When the noise cancellation function is active, the output signal $V_2$ from the amplifier circuit 30 is also given by Eq. (2) and so the output signal $V_3$ (see FIG. 3D) from the subtractor 52 is given by $$\begin{aligned}V_3 &= Ga \times Gp \times (S \times I1 \times B) - Ga \times Gp \times B \\ &= Ga \times Gp \times S \times I1\end{aligned} \tag{3}$$

As is obvious from Eq. (3), the brightness added by the preamplifier circuit 20 is canceled out in the output signal $V_3$ from the subtractor 52. The output signal $V_3$ from the subtractor 52 is applied to the numerator input (X) of the divider circuit 54. The noise signal detected by the noise detection circuit 40 is applied to the denominator input (Y) of the divider circuit 54.

In the present embodiment, the noise detection circuit 40 is configured including an amplifier 42, an effective value computing circuit 44, and a low frequency cut-off circuit 46. The amplifier 42 converts the emission current I2 (see FIG. 3E) detected by the noise cancelling aperture 12 into a voltage and amplifies it by a factor of Gn. Thus, the output signal $V_4$ (see FIG. 3F) from the amplifier 42 is given by $$V_4 = Gn \times I2 \tag{4}$$

The effective value computing circuit 44 computes, in real time, an effective value (RMS) of the output signal $V_4$ from the amplifier 42 in a preset given time. A dedicated IC, for example, may be used as the effective value computing circuit 44.

The output signal $V_{RMS}$ (=(Gn×I2)$_{RMS}$) from the effective value computing circuit 44 has a DC component $V_{DC}$ and a noise component (AC component) $V_{AC}$ and is given by $$V_{RMS} = V_{DC} + V_{AC}$$

The DC component $V_{DC}$ is an ideal effective value component obtained by removing the noise component from the output signal $V_{RMS}$ of the effective value computing circuit 44, and is produced from the effective value computing circuit 44 when there is no emission noise. The noise component (low frequency noise component) $V_{AC}$ is the noise component of the output signal $V_{RMS}$ of the effective value computing circuit 44.

The low frequency cut-off circuit 46 computes, in real time, the DC component $V_{DC}$ of the effective value $V_{RMS}$ of the output signal $V_4$ from the amplifier 42, the effective value being computed by the effective value computing circuit 44. A dedicated IC, for example, may be used as the low frequency cut-off circuit 46.

The divider circuit 54 has a numerator input (X) and a denominator input (Y) to which the output signal $V_3$ from the subtractor 52 and the output signal $V_4$ from the amplifier 42 are respectively applied. The divider circuit 54 performs a division of the output signal $V_3$ by the output signal $V_4$. Therefore, using Eqs. (3) and (4), the output signal $V_5$ (see FIG. 3G) from the divider circuit 54 is given by $$V_5 = \frac{X}{Y} = \frac{V_3}{V_4} = \frac{Ga \times Gp \times S \times I1}{Gn \times I2} \quad (5)$$

The multiplier circuit 58 performs multiplication of the output signal $V_5$ (see FIG. 3G) from the divider circuit 54 by the output signal $V_{DC}$ (see FIG. 3H) from the low frequency cut-off circuit 46. Accordingly, using Eq. (5), the output signal $V_6$ (see FIG. 3I) from the multiplier circuit 58 is given by $$V_6 = \frac{X}{Y} \times Z = \frac{Ga \times Gp \times S \times I1}{Gn \times I2} \times V_{DC} \quad (6)$$

where the emission current I2 is given as follows using the DC component $I2_{DC}$ and noise component $I2_{AC}$:

$$I2 = I2_{DC} + I2_{AC} \quad (7)$$

The output signal $(Gn \times I2)_{RMS} (=V_{RMS})$ from the effective value computing circuit 44 can be approximated by $$(Gn \times I2)_{RMS} = Gn \times (I2)_{RMS} \cong Gn \times I2_{DC}$$

The output signal $V_{DC}$ from the low frequency cut-off circuit 46 is substantially equal to a value obtained by removing the noise component $V_{AC}$ from the output signal $(Gn \times I2)_{RMS} (=V_{RMS})$ of the effective value computing circuit 44. That is, the output signal $V_{DC}$ from the low frequency cut-off circuit 46 is equivalent to an effective value obtained by removing the noise component from the effective value of the noise signal computed by the effective value computing circuit 44. Therefore, the output signal $V_{DC}$ from the low frequency cut-off circuit 46 can be approximated by $$V_{DC} \cong Gn \times I2_{DC} \quad (8)$$

Therefore, if $I1 = I2 \times n$ and Eqs. (7) and (8) are substituted into Eq. (6), the output signal $V_6$ from the multiplier circuit 58 is approximated by $$V_6 \cong \frac{Ga \times Gp \times S \times (I2_{DC} + I2_{AC}) \times n}{Gn \times (I2_{DC} + I2_{AC})} \times (Gn \times I2_{DC}) \quad (9)$$
$$= Ga \times Gp \times S \times I2_{DC} \times n$$

In Eq. (9), $I2_{DC}$ is an ideal DC current obtained by removing the noise component $I2_{AC}$ from the emission current I2 and is an emission current detected by the noise detection circuit 40 when there is no emission noise. Furthermore, from $I1 = I2 \times n$, it is seen that $I2_{DC} \times n$ is equivalent to the ideal DC current $I1_{DC}$ obtained by removing the emission current from I1.

Accordingly, if $I2_{DC} \times n = I1_{DC}$ is substituted into Eq. (9), the output signal $V_6$ from the multiplier circuit 58 is approximated by $$V_6 \cong Ga \times Gp \times S \times I1_{DC} \quad (10)$$

The adder 56 sums up the output signal $V_6$ from the multiplier circuit 58 and the output signal $(Gp \times Ga \times B)$ from the amplifier 57. Thus, the output signal $V_7$ (see FIG. 3J) from the adder 56 is approximated by $$V_7 \cong Ga \times Gp \times S \times I1_{DC} + Ga \times Gp \times B \quad (11)$$
$$= Ga \times Gp \times (S \times I1_{DC} + B)$$

The output signal $V_7$ from the adder 56 is applied to the processing section 60 via the switch circuit 59. The processing section 60 performs an analog-to-digital conversion of the output signal of the adder 56 by the A/D converter 62, then arithmetically processes the resulting data (e.g., averages the data) to thereby generate image data, and sends the data to the PC 2 shown in FIG. 1. The PC 2 receives the image data generated by the processing section 60, writes the data into the frame buffer, displays an image of the sample A from which emission noise has been removed or reduced on its display, and stores or otherwise processes the data.

The ideal DC current $I1_{DC}$ of Eq. (11) is nearly equal in value to the emission current impinging on the sample A when there is no emission noise. Consequently, an STEM image can be observed while making adjustments of only two operative parameters, i.e., contrast and brightness, under conditions where Ga, Gp, Gn and the gain given to the brightness that is removed and readded are maintained constant, in the same way as when the noise cancellation function is inactive.

If the emission current decreases with time, the signal applied to the processing section 60 is always given by Eq. (11) and so a signal obtained by removing only noise from the output signal $V_2$ of the amplifier circuit 30 given by Eq. (2) can continue to be obtained.

Eq. (11) representing the signal applied to the processing section 60 when the noise cancellation function is active is similar to Eq. (2) representing the signal applied to the processing section 60 when the noise cancellation function is inactive except that I1 of Eq. (2) is replaced by the ideal DC current $I1_{DC}$. In consequence, it is not necessary to perform a cumbersome adjustment whenever the noise cancellation function is turned on or off.

Figure 4:
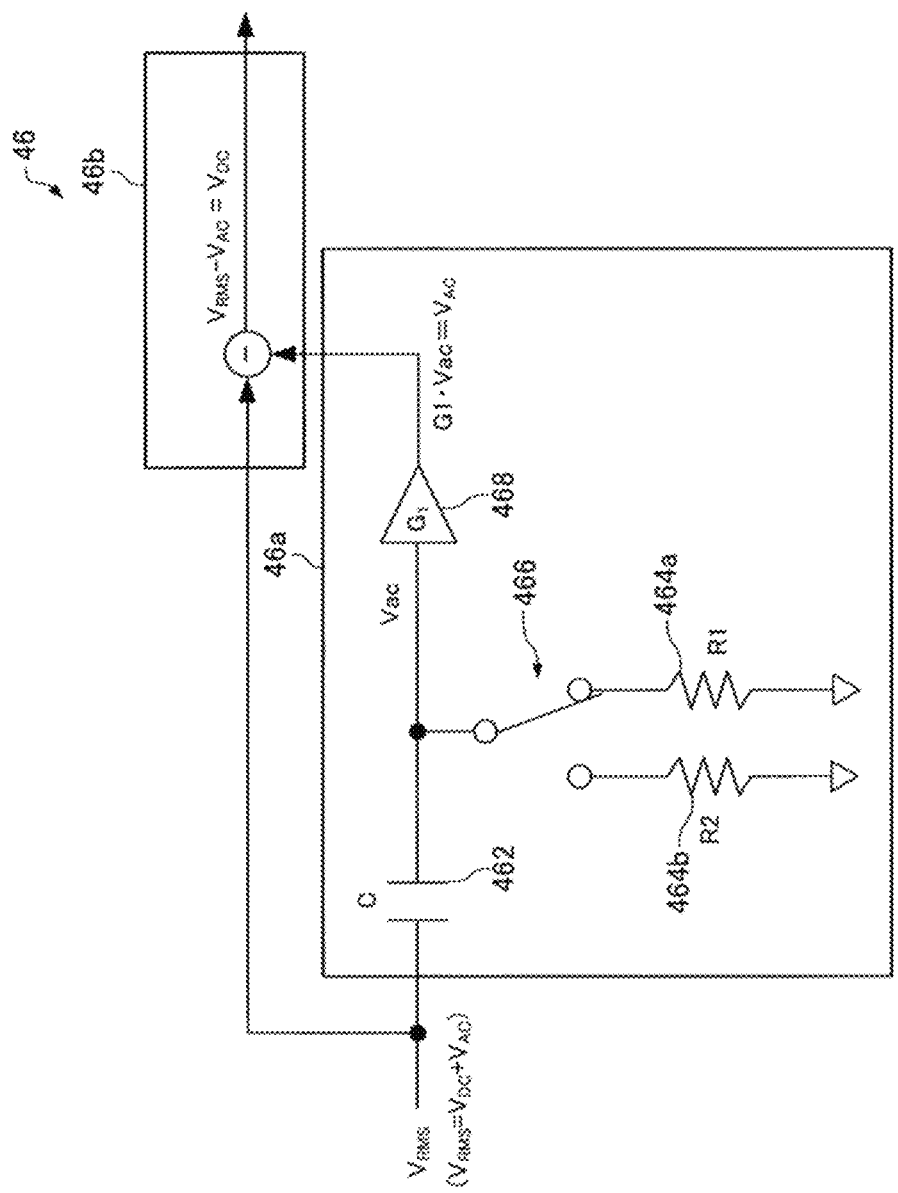
FIG. 4 is a circuit diagram showing one example of the configuration of a low frequency cut-off circuit included in the signal processing circuitry of FIG. 2.
Figure 5:
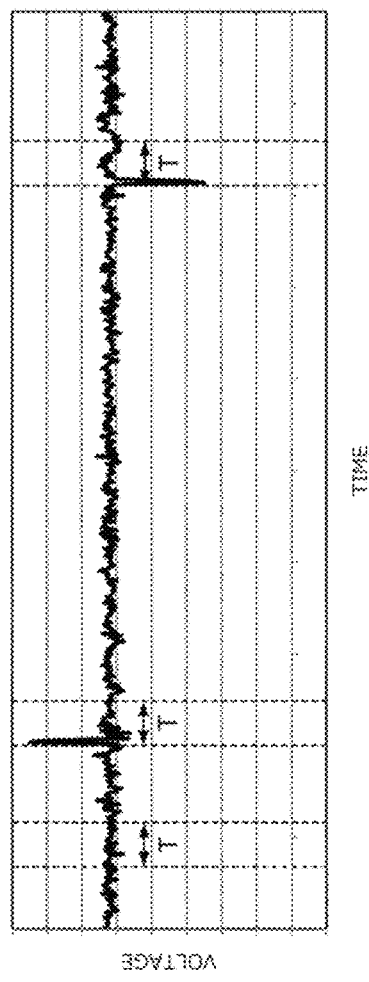
FIG. 5 is a diagram showing one example of noise signal.
Figure 6:
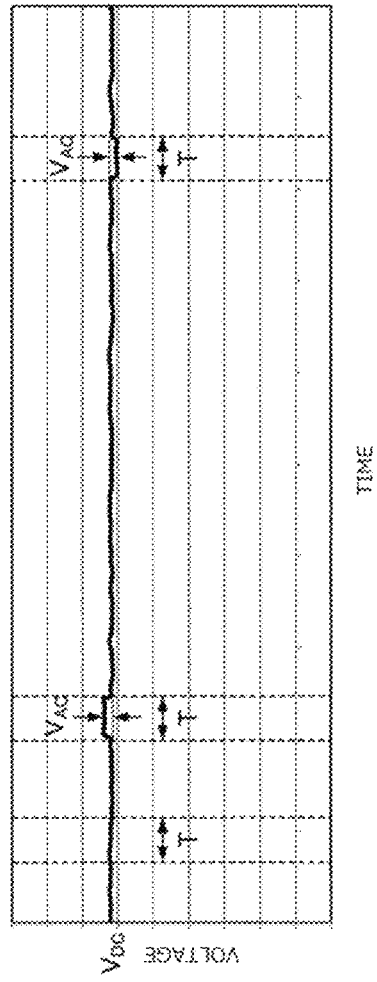
FIG. 6 is a diagram showing one example of signal waveform at various nodes in the low frequency cut-off circuit.
Figure 7:
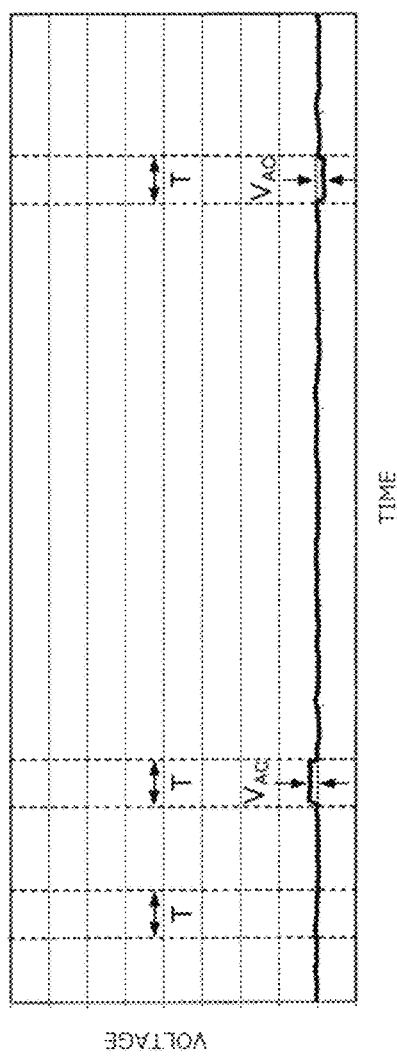
FIG. 7 is a diagram showing another example of signal waveform at various nodes in the low frequency cut-off circuit.
Figure 8:
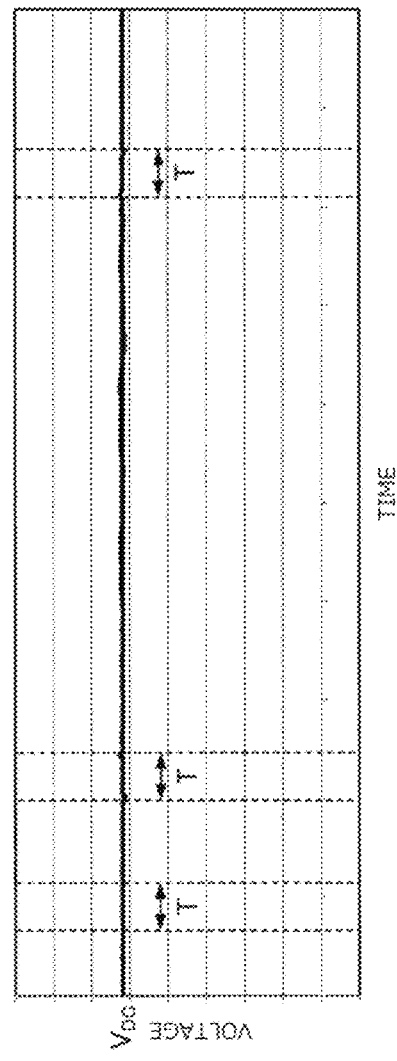
FIG. 8 is a diagram showing a further example of signal waveform at various nodes in the low frequency cut-off circuit.

FIG. 4 is a diagram showing one example of configuration of the low frequency cut-off circuit 46. FIG. 5 is a diagram showing one example of the noise signal that is the output signal $V_4$ from the amplifier 42. FIGS. 6-8 show examples of signal waveform at various nodes in the low frequency cut-off circuit 46 shown in FIG. 4. In the example of FIG. 4, the low frequency cut-off circuit 46 is configured including an AC component extractor circuit 46a and a subtractor circuit 46b.

An example in which noise of large amplitude enters the noise signal (output signal $V_4$ from the amplifier 42) is described below by referring to FIG. 5. It is now assumed that the time taken to acquire an STEM image is Ts (s) and that the time taken to compute an effective value is T (s). For convenience, it is assumed that Ts>T. In the present embodiment, Ts>T is not a prerequisite. For example, Ts≤T is also permissible.

The output signal $V_{RMS}$ (see FIG. 6) from the effective value computing circuit 44 is applied to the low frequency cut-off circuit 46. When noise of large amplitude enters the noise signal during the time T taken to compute the effective value as shown in FIG. 5, the output signal $V_{RMS}$ from the effective value computing circuit 44 contains the low frequency noise component $V_{AC}$ of relatively long duration as shown in FIG. 6.

The AC component extractor circuit 46a extracts the noise component $V_{AC}$ from the output signal $V_{RMS}$ of the effective value computing circuit 44. The AC component extractor circuit 46a is configured including a capacitor 462, a first resistor 464a, a second resistor 464b, a switch circuit 466, and an amplifier 468.

In the AC component extractor circuit 46a, a high pass filter is formed by the capacitor 462 and the first resistor 464a. Using this high pass filter, only AC components of frequencies higher than frequency f1 are extracted from the output signal $V_{RMS}$ of the effective value computing circuit 44. It is assumed that the high pass filter detects frequency components higher than f1 ($=1/(2 \cdot \pi \cdot c \cdot R1)$) and satisfies the condition, f1<1/T ($f_T$). C is the capacitance of the capacitor 462. R1 is the resistance value of the first resistor 464a. $f_T$ is the reciprocal of the time taken to compute an effective value.

For the AC component $V_{ac}$ detected by the high pass filter, the gain is corrected by the amplifier 468 (G1×Vac). Undesired high frequency components are filtered out by a low pass filter (not shown). The gain of the amplifier 468 does not need to be corrected. The output signal $V_{AC}$ (see FIG. 7) from the amplifier 468 is applied to the subtractor circuit 46b. This output signal $V_{AC}$ from the amplifier 468 has frequencies higher than the cut-off frequency $f_{HPF}$ of the high pass filter.

The subtractor circuit 46b subtracts the output signal $V_{AC}$ of the amplifier 468 (i.e., the output signal of the AC component extractor circuit 46a) from the output signal $V_{RMS}$ of the effective value computing circuit 44.

$$V_{RMS} - V_{AC} = V_{DC} \quad (13)$$

As a result, the output signal $V_{DC}$ (see FIG. 8) from the noise detection circuit 40 is less affected or unaffected by the effects of noises of large amplitudes in the output signal $V_{RMS}$ from the effective value computing circuit 44. The output signal from the subtractor circuit 46b (the output signal from the low frequency cut-off circuit 46) $V_{DC}$ is applied to the multiplier circuit 58 shown in FIG. 2.

When the size of the noise cancelling aperture 12 is modified or a given operation such as turning on or off of the electron beam emitted from the electron beam source 11 is performed, the potential of the noise signal (output signal from the amplifier 42) varies greatly as shown in FIG. 9. In this case, the capacitor 462 forming the high pass filter is electrically charged and discharged in longer times and so the responsiveness of the low frequency cut-off circuit 46 drops. That is, the time taken until the low frequency cut-off circuit 46 first provides an output signal since this given operation is performed is prolonged.

Therefore, in the present embodiment, the low frequency cut-off circuit 46 has the switch circuit 466 for switching the resistor, which is coupled to the capacitor 462 and forms a high pass filter, between the first resistor 464a and the second resistor 464b under the control of the processing section 60. The operation of the processing section 60 to control the switch circuit 466 is described below.

In the electron microscope of the present embodiment, when an STEM image has been acquired, the capacitor 462 and the first resistor 464a are connected together, forming a high pass filter. The processing section 60 can sense any modification of the size of the noise cancelling aperture 12 and operations involving great variations in the potential of the noise signal such as turning on or off of the electron beam emitted from the electron beam source 11.

When such an operation is sensed, the processing section 60 causes the switch circuit 466 to switch the resistor connected with the capacitor 462 from the first resistor 464a to the second resistor 464b. Consequently, the capacitor 462 and the second resistor 464b together make up a high pass filter.

Because the resistance value R2 of the second resistor 464b is much smaller than the resistance value R1 of the first resistor 464a (R1>>R2), the capacitor 462 is electrically charged or discharged in quick response to variations in the potential of the output signal from the amplifier 42. It suffices that the resistance value R2 of the second resistor 464b be smaller than the resistance value R1 (R1>R2).

When a preset given time has passed since the switching from the first resistor 464a to the second resistor 464b, the processing section 60 causes the switch circuit 466 to switch the resistor connected with the capacitor 462 from the second resistor 464b to the first resistor 464a. As a result, the capacitor 462 and the first resistor 464a together make up a high pass filter. The aforementioned given time is sufficiently long compared with the time constant of C×R2, and is set based both on the capacitance C of the capacitor 462 and on the resistance value R2 of the second resistor 464b.

Because of the processing described so far, when a given operation involving great variations in the potential of the noise signal is performed, the time taken until the low frequency cut-off circuit 46 first provides an output signal since the beginning of the given operation can be shortened. That is, if a given operation inducing great variations in the potential of the noise signal is performed, the low frequency cut-off circuit 46 can respond quickly.

Furthermore, in the present embodiment, the low frequency cut-off circuit 46 is provided and so the bandwidth of the effective value computing circuit 44 can be extended for the following reason.

FIG. 10 shows one example of the bandwidth of a prior art effective value computing circuit 44 pertinent to the present disclosure in a case where the noise detection circuit 40 does not have the low frequency cut-off circuit 46. In this case, as seen in JP-A-2013-258030, the bandwidth of the effective value computing circuit 44 must be narrower than the frequency $f_{NOISE}$ of the noise signal in order to bring the effective value computed by the effective value computing circuit 44 close to a direct current (DC component). However, if the bandwidth of the effective value computing circuit 44 is made too narrow, the contrast of the STEM image varies so as to form a gradation pattern in response to variations in the potential of the noise signal at intervals of time corresponding to the bandwidth of the effective value computing circuit 44 (time taken to compute the effective value) when the STEM image is acquired. Therefore, the bandwidth of the effective value computing circuit 44 must be made wider than ideal. As a result, noise components which are produced by computation of the effective value of the noise signal and which are within the bandwidth (from DC to $f_{RMS}$) of the effective value computing circuit 44 are contained in the output signal from the multiplier circuit 58.

FIG. 11 is a diagram showing one example of the bandwidth of the effective value computing circuit 44 of the first embodiment. FIG. 12 is a diagram showing one example of the bandwidth of the AC component extractor circuit 46a of the first embodiment. FIG. 13 is a diagram showing one example of the bandwidth of the low frequency cut-off circuit 46 of the first embodiment after removal of the noise component $V_{AC}$.

In the low frequency cut-off circuit 46 of the present embodiment, a signal of $f_{HPF}$ to $f_{RMS}$ from which components quite close to a direct current have been removed can be derived from the output signal $V_{RMS}$ of the effective value computing circuit 44 by the AC component extractor circuit 46a (i.e., by AC coupling) as shown in FIG. 12. Furthermore, the low frequency cut-off circuit 46 can yield results similar to the results produced when an effective value computing circuit having a very narrow bandwidth is used, by subtracting the output signal $V_{AC}$ of the AC component extractor circuit 46a from the output signal $V_{RMS}$ of the effective value computing circuit 44 as can be seen from FIG. 13. As a result, the time taken to compute the effective value can be shortened. Also, the effective value can be computed while eliminating components quite close to a direct current (DC).

In this way, in the present embodiment, as shown in FIG. 11, if the bandwidth (from DC to $f_{RMS}$) of the effective value computing circuit 44 is extended, an effective value can be computed while removing components quite close to a direct current (DC) owing to the low frequency cut-off circuit 46 as shown in FIG. 13. This can shorten the period of time in which the bandwidth of the effective value computing circuit 44 is extended and the contrast varies so as to form a gradation pattern.

Where a high pass filter employing AC coupling is used, a time taken to charge and discharge the capacitor is required. It is desired to set the cut-off frequency $f_{HPF}$ of the high pass filter to a value closer to a direct current (DC) but a longer charging/discharging time is required. If this charging/discharging time is longer than the time taken to compute the effective value in a case where the noise detection circuit 40 does not have the low frequency cut-off circuit 46, then shortening this computation time is meaningless.

As described previously, the AC component extractor circuit 46a of the present embodiment has the switch circuit 466 and, therefore, if the potential of the noise signal varies greatly, then the connected resistor is switched to the second resistor 464b by the switch circuit 466 such that the capacitor is charged or discharged in a short time. Then, the connected resistor is switched to the first resistor 464a, and the cut-off frequency $f_{HPF}$ can be set to a frequency close to a direct current. As a result, the capacitor 462 can be charged and discharged in a time shorter than the time taken to compute the effective value. The switching via the switch circuit 466 may be done during the computation of the effective value.

In the present embodiment, the electron beam source 11 is equivalent to the "electron beam source" of the present invention. The noise cancelling aperture 12 and the amplifier 42 are equivalent to the "electron beam detector" of the present invention. The effective value computing circuit 44 and the low frequency cut-off circuit 46 are equivalent to the "DC component extractor" of the present invention. The image detector 15, the preamplifier 20, and the amplifier circuit 30 are equivalent to the "image detector" of the present invention. The divider circuit 54 and the multiplier circuit 58 are equivalent to the "arithmetic section" of the present invention. The effective value computing circuit 44 is equivalent to the "effective value computing section" of the present invention. The AC component extractor circuit 46a is equivalent to the "AC component extractor" of the present invention. The subtractor circuit 46b is equivalent to the "subtractor" of the present invention. The switch circuit 466 is equivalent to the "switching means" of the present invention.

The electron microscope 1 of the first embodiment has the following features. In this electron microscope, the gain of the noise cancelling circuit 50 can be selected irrespective of the image signal by extracting the DC component of an effective value of a noise signal by the low frequency cut-off circuit 46 and multiplying the output signal from the divider circuit 54 by the output signal from the low frequency cut-off circuit 46 with the multiplier circuit 58. Consequently, if various settings of the illumination system, imaging system, and detection system are varied for image observation, the gain does not vary but can be kept constant. The gain will vary only when the beam current present above the noise cancelling aperture 12 is varied. Because the effective value (DC component) of the noise signal is computed, a noise-canceled image signal of unity magnification can be obtained after a certain time (e.g., several seconds to tens of seconds) that is set for the circuitry even if no manipulation is performed. This dispenses with adjustment of the gain. As a result, if a cold field-emission gun (CFEG) is used as the electron beam source 11, imaging free from emission noise is enabled by manipulations similar to those performed on a Schottky type electron gun.

In the electron microscope of the first embodiment, a division is performed using analog signals and so connection with external equipment can be easily made. More latitude is given to the range of input voltage than where a division is performed by digital computations. Emission noises detected by many electron microscope-related detectors available in the market can be canceled by the technique of the present invention and, therefore, greatly improved general versatility can be provided.

In the electron microscope of the first embodiment, if noise of large amplitude enters the noise signal, the effective value of the noise signal is affected by the noise for a given time corresponding to the time taken to compute the effective value. However, the effects of the noise can be reduced or removed by extracting the DC component of the effective value of the noise signal. Therefore, if noise of large amplitude enters a noise signal, the technique of the present embodiment makes it possible to obtain a good STEM image having reduced contrast nonuniformity by reducing the effects of noise contained in the effective value of the noise signal.

In the electron microscope of the first embodiment, the effective value computing circuit 44 computes an effective value of a noise signal, the AC component extractor circuit 46a extracts the AC component of the output signal from the effective value computing circuit 44, and the subtractor circuit 46b performs subtraction of the AC component extracted by the AC component extractor circuit 46a from the output signal of the effective value computing circuit 44. Consequently, the AC component can be removed from the output signal of the effective value computing circuit 44, and the DC component can be extracted.

In the electron microscope of the first embodiment, when the processing section 60 detects a given operation, an operation for controlling the switch circuit 466 such that the resistor connected with the capacitor 462 is switched from the first resistor 464a to the second resistor 464b and an operation for controlling the switch circuit 466 such that the resistor connected with the capacitor 462 is switched from the second resistor 464b to the first resistor 464a at the instant when a given time has passed since the switching from the first resistor 464a to the second resistor 464b are performed. Consequently, if a given operation involving large variations in the potential of the noise signal is done, the time taken until the low frequency cut-off circuit 46 first provides an output signal since the beginning of this given operation can be shortened.

In the electron microscope of the first embodiment, computation times spent by the effective value computing circuit 44 and the low frequency cut-off circuit 46 can be shortened, for example, as compared to the computation time taken in the prior art effective value computing circuit of JP-A-2013-258030 for the following reason.

FIG. 14 is a diagram showing one example of the effective value computed by the prior art effective value computing circuit in a case where the computation time is long. FIG. 15 is a diagram showing one example of the effective value computed by the prior art effective value computing circuit in a case where the computation time is short.

As shown in FIGS. 14 and 15, in the prior art effective value computing circuit, as the computation time taken to compute the effective value is made shorter, the computed effective value varies to a greater extent. As a result, the noise canceling capability deteriorates. Accordingly, in the prior art effective value computing circuit, the time taken to compute the effective value must be set to a value longer, for example, than the time (on the order of seconds) taken for the PC 2 to acquire one frame of STEM image of the sample A. No STEM image can be derived while the effective value computing circuit is computing the effective value. Therefore, during this interval of time, the electron microscope is on standby, i.e., the user cannot manipulate the instrument.

In the electron microscope of the present embodiment, the low frequency cut-off circuit 46 can reduce variations in the contrast of an STEM image due to low frequency noise components produced in the effective value computing circuit 44 as described previously. Also, the switch circuit 466 can set the charging/discharging time of the capacitor 462 to a sufficiently negligible time. As a result, if the time taken to compute the effective value is set shorter than conventional, the resulting contrast nonuniformity is canceled out prior to the division and multiplication. Also, the operation of the effective value computing circuit 44 can be sped up. That is, in the present embodiment, if the time taken to compute the effective value is shorter than the time taken to obtain one frame of STEM image, good STEM images having less contrast nonuniformity than conventional can be derived. Therefore, in the present embodiment, the time taken to compute the effective value can be shortened and thus the user's wait time can be shortened. Consequently, the sense of use can be improved.

2. Second Embodiment

Figure 16:
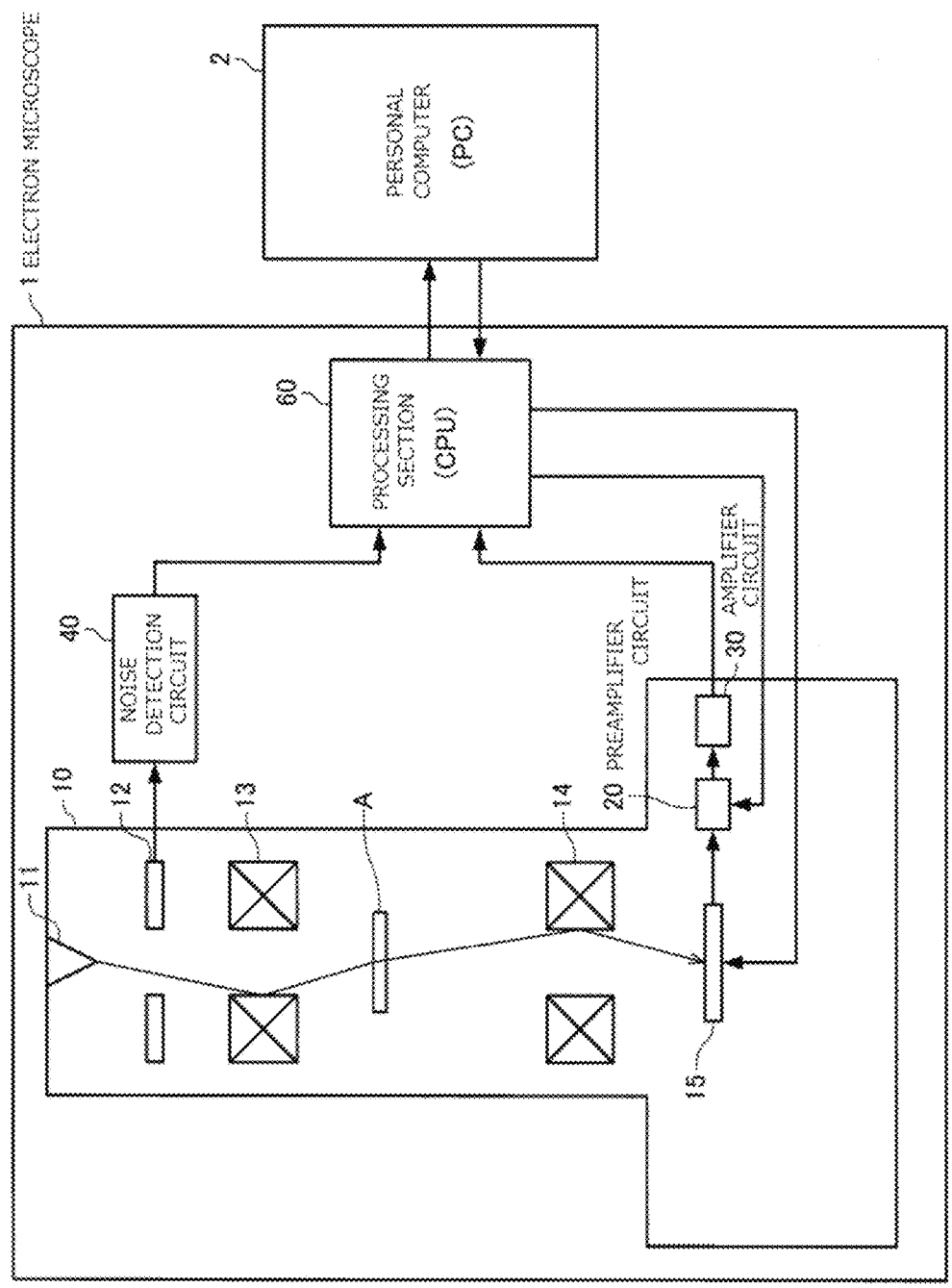
FIG. 16 is a block diagram showing one example of the configuration of an electron microscope according to a second embodiment of the present invention.
Figure 17:
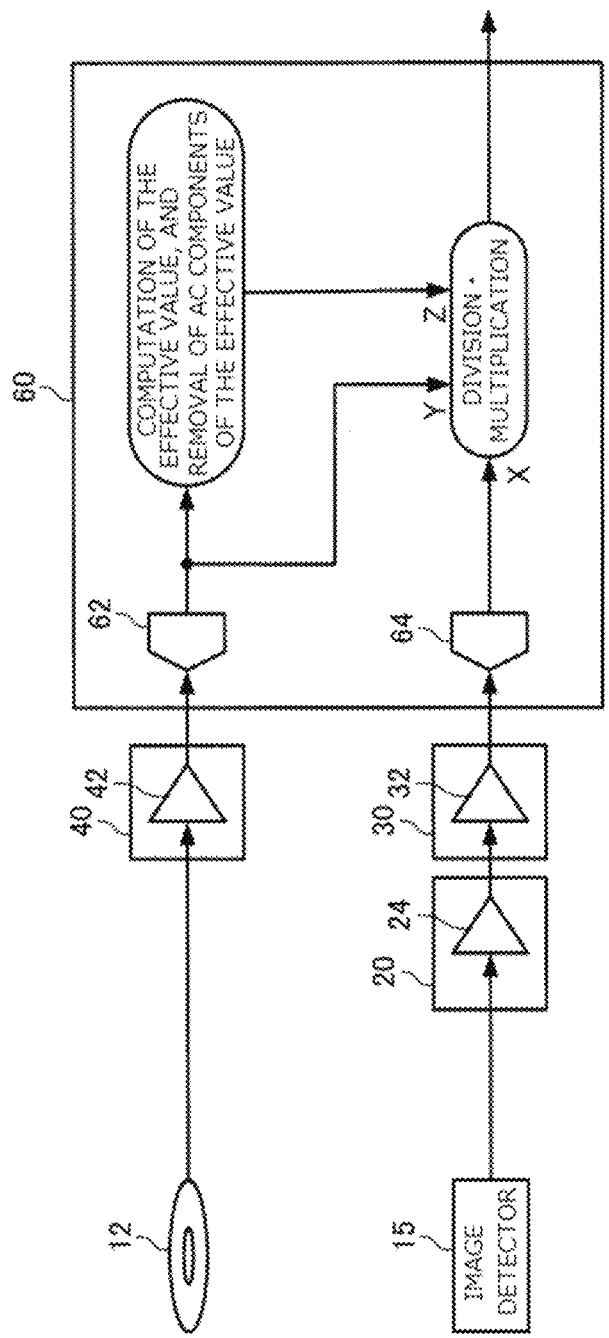
FIG. 17 is a block diagram showing one example of the specific configuration of signal processing circuitry included in the electron microscope of FIG. 16.

FIG. 16 is a diagram showing one example of configuration of an electron microscope according to a second embodiment. FIG. 17 shows an example of specific configuration of signal processing circuitry included in the microscope of FIG. 16. Those members of the electron microscope of FIGS. 16 and 17 which are identical in configuration to their respective counterparts of FIGS. 1 and 2 are indicated by the same reference numerals as in FIGS. 1 and 2 and a description thereof is omitted.

As shown in FIGS. 16 and 17, the electron microscope 1 according to the second embodiment is similar to the electron microscope 1 of FIGS. 1 and 2 according to the first embodiment except that the effective value computing circuit 44, low frequency cut-off circuit 46, and noise cancelling circuit 50 are omitted and that the processing section 60 performs noise cancellation by digital computations (e.g., computation of the effective value, removal of AC components of the effective value, division, multiplication, subtraction of an offset, and addition of an offset). The subtraction of an offset and addition of an offset are performed in a similar way to the first embodiment except for relying on digital computations and so their description and illustration are omitted.

In the present embodiment, the output signal from the amplifier 42 and the output signal from the amplifier 32 are applied to the processing section 60 and analog-to-digital converted by A/D converters 62 and 64, respectively. The processing section 60 computes the effective value $V_{RMS}$ of the output value of the A/D converter 62 over a preset given time by digital computation.

Furthermore, the processing section 60 removes, by digital computation, the noise component $V_{AC}$ of the effective value $V_{RMS}$ from the result of computation of the effective value $V_{RMS}$. In particular, the processing section 60 computes, by digital computation, an average value (moving average) of the effective value $V_{RMS}$. Consequently, the noise component $V_{AC}$ of the effective value is removed from the computed effective value, and the DC component $V_{DC}$ of the effective value can be extracted.

FIG. 18 is a diagram showing one example of the bandwidth of the effective value $V_{RMS}$. FIG. 19 is a diagram showing one example of the bandwidth of the average value of the effective value $V_{RMS}$, obtained using a digital filter.

The operation of the processing section 60 to compute the average value of the effective value $V_{RMS}$ is performed by a low pass filter in the form of a digital filter having a cut-off frequency of $f_{LPF}$. Because of this operation, the component of the bandwidth of from DC to $f_{LPF}$ can be extracted from the average value of the effective value $V_{RMS}$ as shown in FIG. 19.

The processing section 60 performs a division by digital computation while taking the output value from the A/D converter 64 and the output value from the A/D converter 62 as the numerator (X) and the denominator (Y), respectively. The quotient (result of the decision) is multiplied by the DC component $V_{DC}$ (Z) of the extracted effective value. The processing section 60 furnishes the result of this computation to the PC 2 shown in FIG. 16.

In the present embodiment, if the processing section 60 senses an operation involving a large variation in the noise signal (output signal from the amplifier 42) such as a modification of the size of the noise cancelling aperture 12 or turning on or off of the electron beam emitted from the electron beam source 11, the processing section once cancels out the result of computation of the effective value performed heretofore and then restarts a computation of the effective value.

Let t1 be the time taken to compute the effective value. Let t2 be the sampling interval at which the effective value is sampled. A computation time t3 taken to compute an average value of N data elements is t3=t1+N×t2. Therefore, if a target number of data elements which give a precise value as an average value of the effective value is N, then data cannot be treated as data permitting computation of an average value until the time t3 passes. That is, an STEM image cannot be obtained until at least the time t3 passes.

Let n be the number of data elements about an effective value. In the present embodiment, if n<m (where m is an average minimum number of data elements giving bare minimum precision as the average value of the effective value), the processing section 60 uses an effective value $V_{RMS}$ instead of the DC component $V_{DC}$ of the effective value used for the above-described division and multiplication.

Where m≤n<N, the processing section 60 uses an average value of n data elements about the effective value as the DC component $V_{DC}$ of the effective value used for the above-described division and multiplication. Where n≥N, the processing section 60 uses an average value of the most recent N data elements about the effective value as the DC component $V_{DC}$ of the effective value used for the division and multiplication. Owing to the processing described so far, when a given operation involving great variations in the potential of the noise signal takes place, it is possible to shorten the time taken until a result of computation of an average value is first output since the beginning of this given operation.

In the present embodiment, the electron beam source 11 is equivalent to the "electron beam source" of the present invention. The noise cancelling aperture 12 and amplifier 42 are equivalent to the "electron beam detector" of the present invention. The image detector 15, preamplifier circuit 20, and amplifier circuit 30 are equivalent to the "image detector" of the present invention. The processing section 60 is equivalent to the "DC component extractor" and the "arithmetic section" of the invention for performing division and multiplication. The electron microscope according to the second embodiment described so far yields advantageous effects similar to those produced by the first embodiment.

Furthermore, in the electron microscope according to the second embodiment, when a given operation is detected, the processing section 60 starts an operation for computing an average value of an effective value. When the number of data elements n of the effective value is less than the target number N, the processing section 60 causes an average value of N data elements to be taken as the DC component of the effective value. When the number of data elements n about the effective value is equal to or greater than the target number N, the processing section causes an average value of N data elements to be taken as the DC component of the effective value. Consequently, when a given operation takes place, it is possible to shorten the time taken from the beginning of this given operation to when a result of a computation of an average value is first output.

Figure 20:
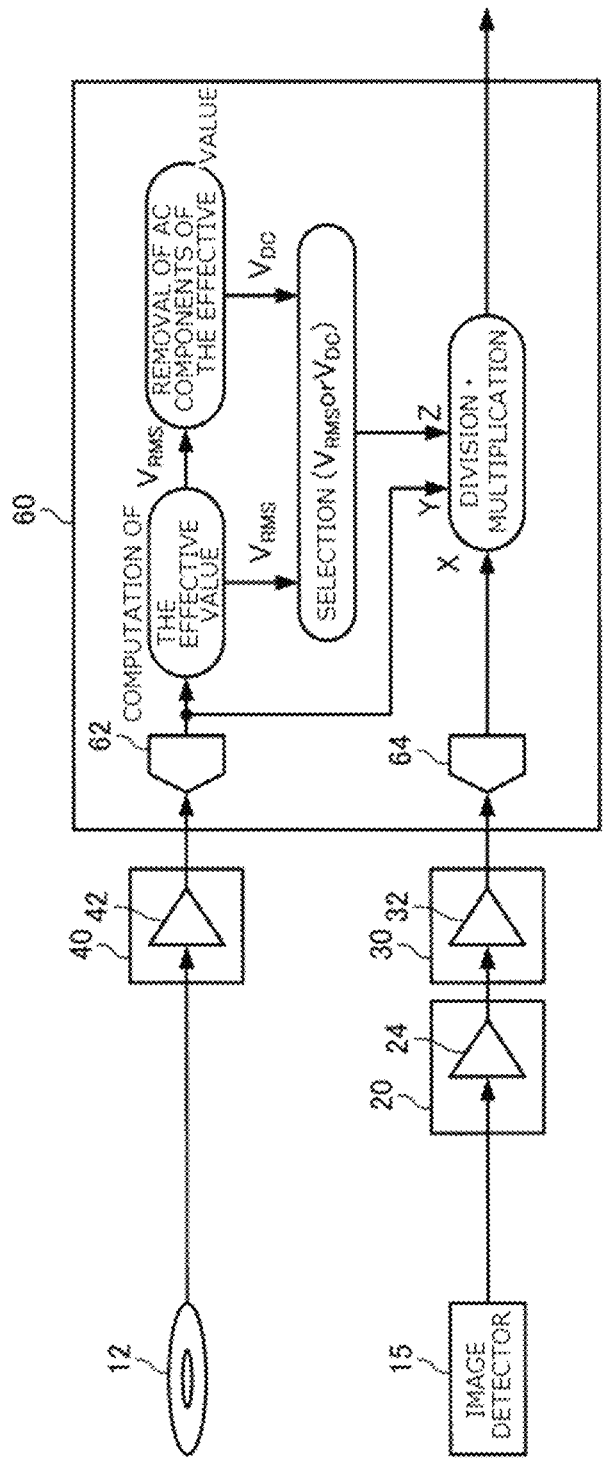
FIG. 20 is a diagram similar to FIG. 17, but showing another example of the specific configuration.
Figure 21:
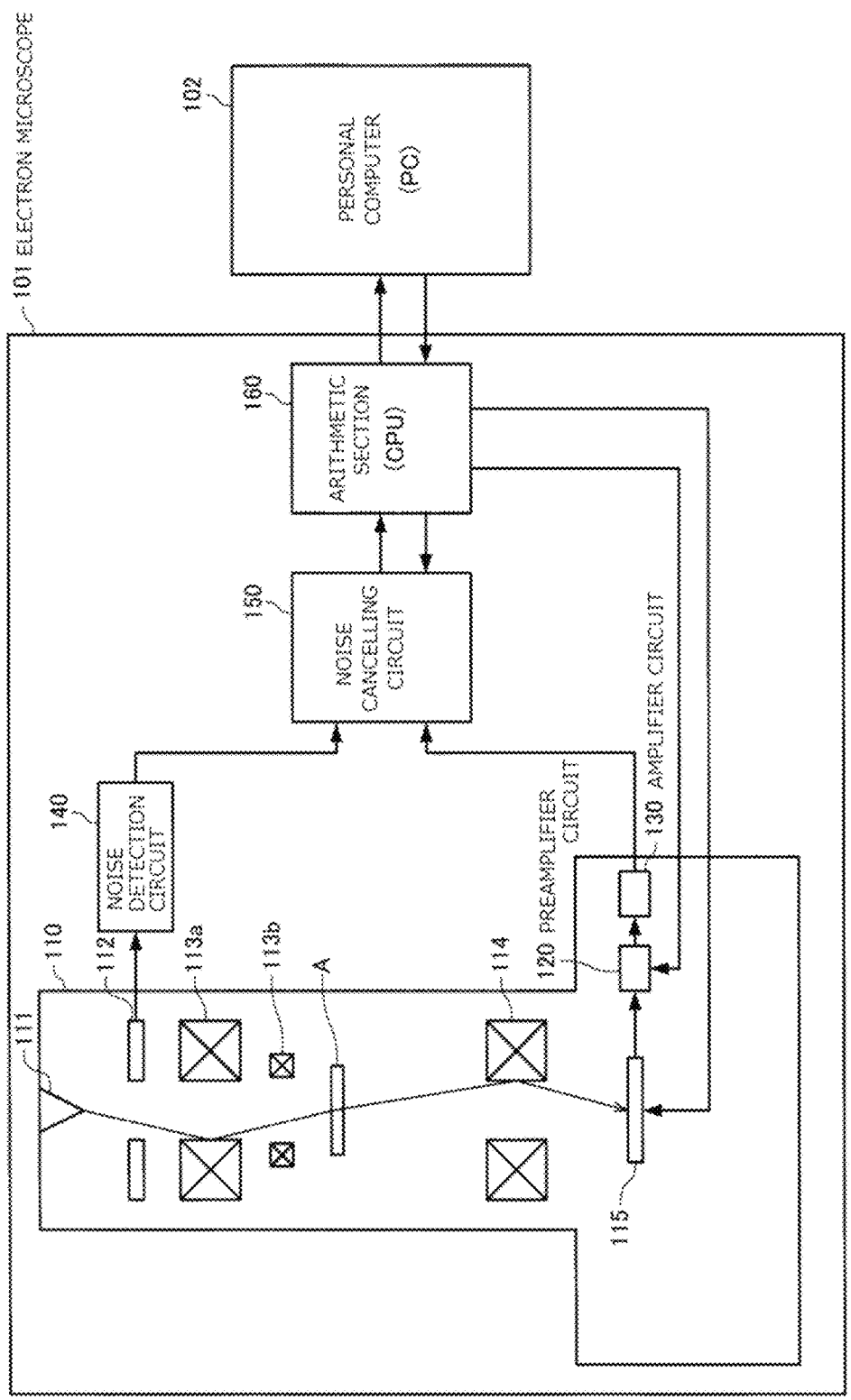
FIG. 21 is a block diagram of a scanning transmission electron microscope having a general noise cancellation function.
Figure 22:
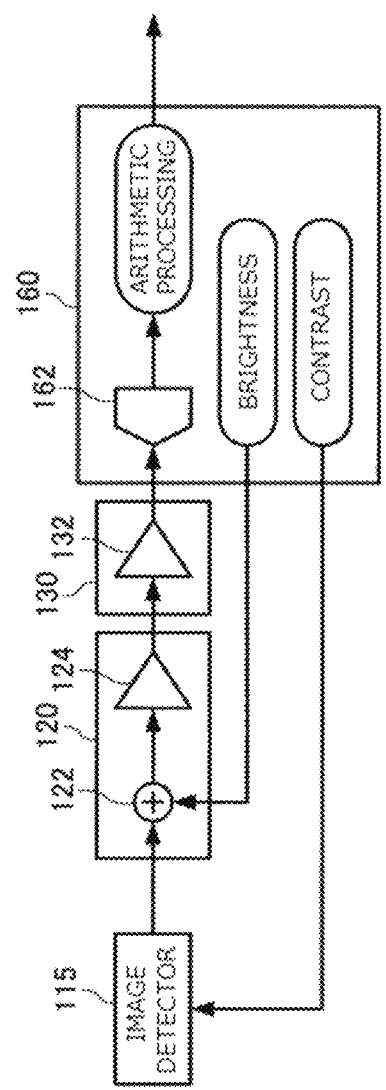
FIG. 22 is a circuit diagram showing one example of the specific configuration of the signal processing circuitry of the conventional electron microscope under the condition where the noise cancellation function is not used.
Figure 23:
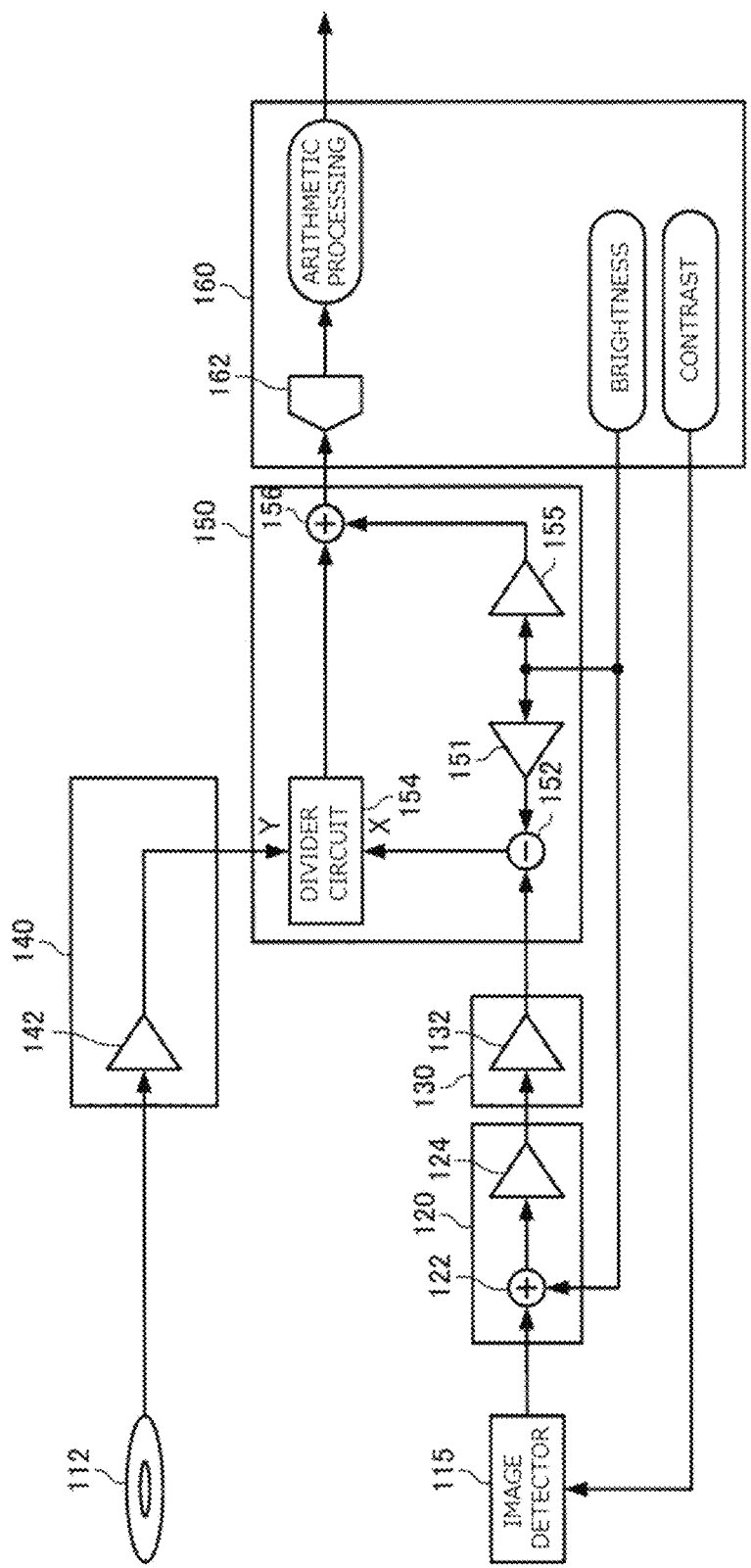
FIG. 23 is a diagram similar to FIG. 22, but under the condition where the noise cancellation function is used.
Figure 24:
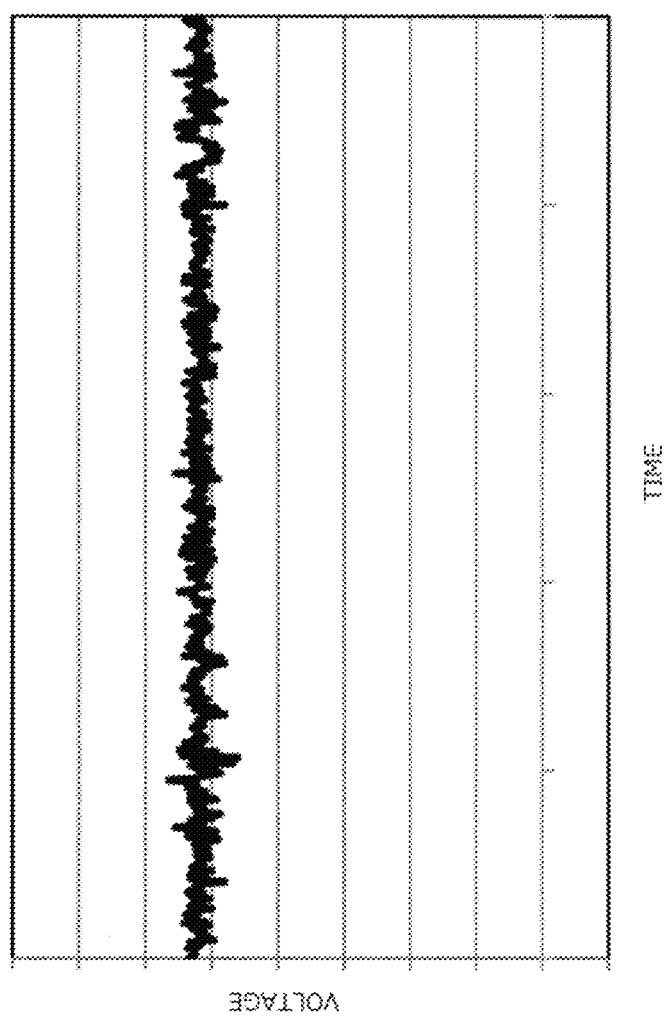
FIG. 24 is a diagram showing one example of noise signal in a case where there is no noise of large amplitude.
Figure 25:
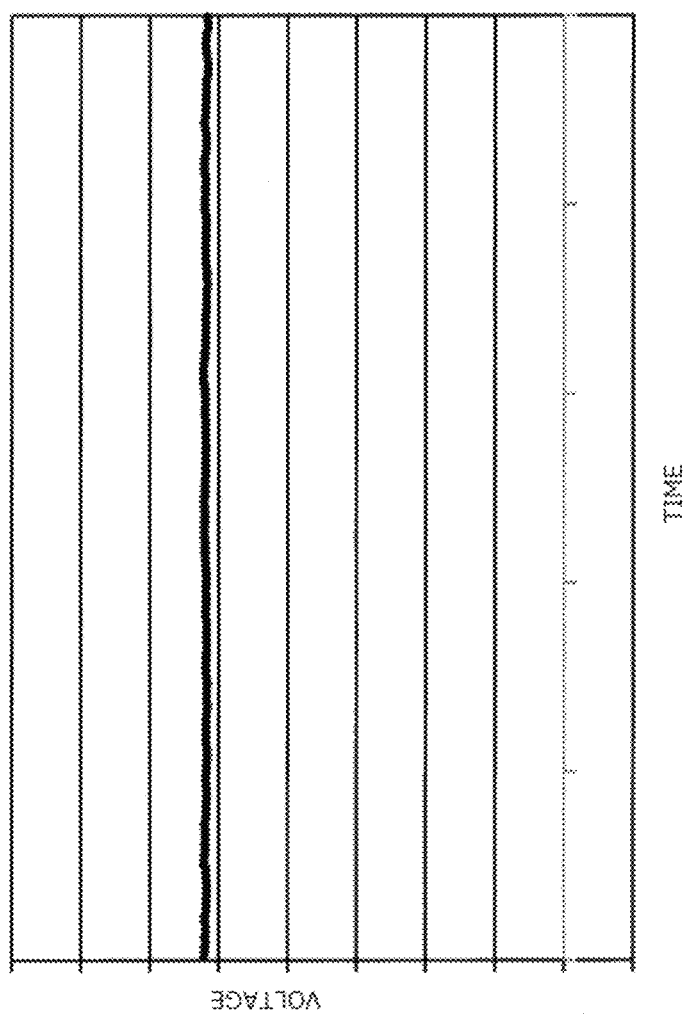
FIG. 25 is a diagram showing a result of computation of an effective value of the noise signal of FIG. 24.
Figure 26:
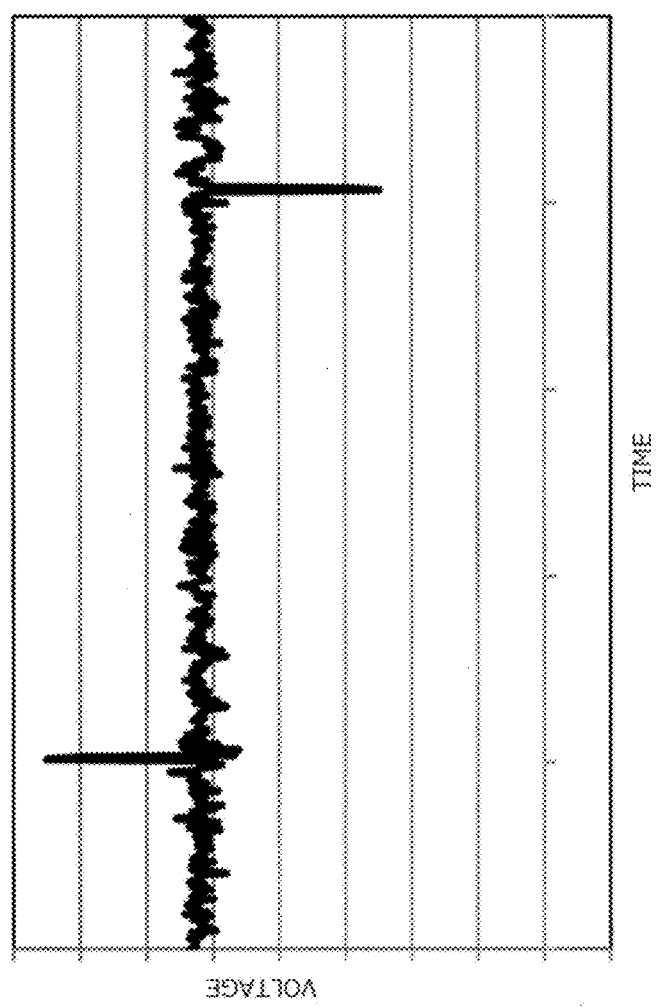
FIG. 26 is a diagram showing one example of noise signal in a case where there is noise of large amplitude.
Figure 27:
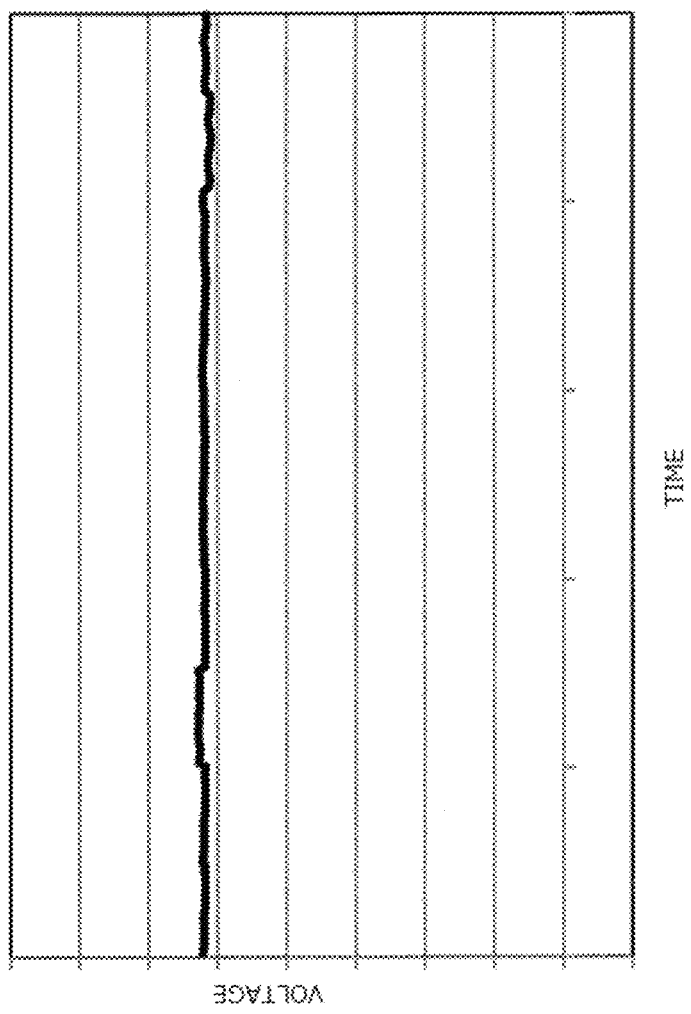
FIG. 27 is a diagram showing a result of computation of an effective value of the noise signal of FIG. 26.
Figure 28:
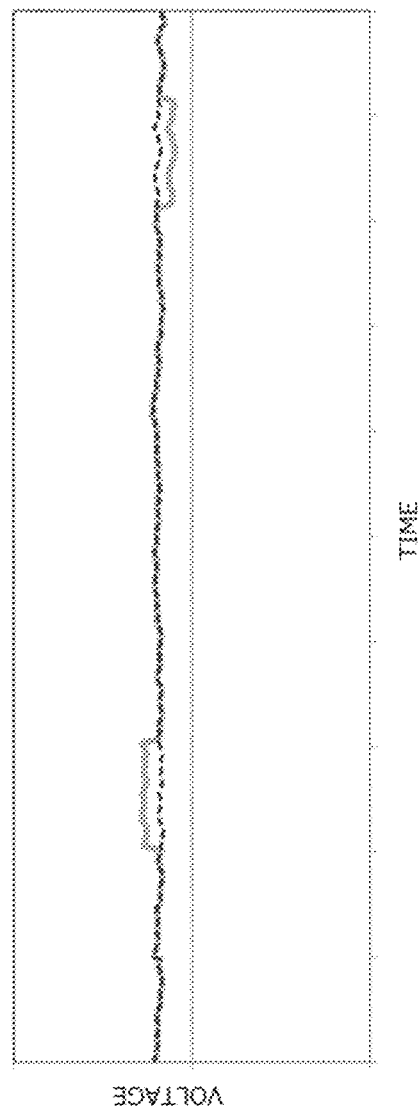
FIG. 28 is a diagram obtained by enlarging parts of FIGS. 25 and 27 and superimposing them one above the other.
Figure 29:
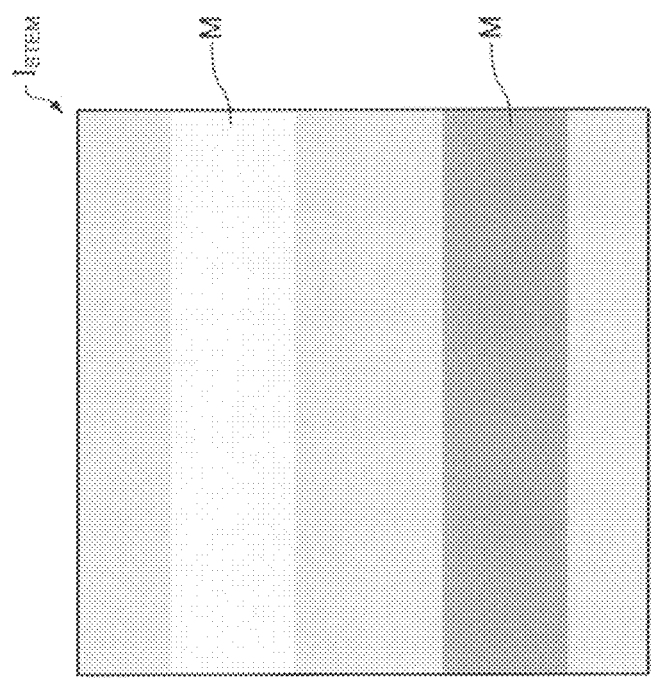
FIG. 29 is a schematic representation of an STEM image from which emission noise has been removed by the use of the computed effective value (FIG. 27) of the noise signal shown in FIG. 26.

FIG. 20 is a diagram showing another example of the specific configuration of the signal processing circuitry of the second embodiment. Those components of the signal processing circuitry of FIG. 20 which are identical in configuration to their respective counterparts of FIG. 17 are indicated by the same reference numerals as in FIG. 17 and a description thereof is omitted.

The modification illustrated in FIG. 20 is similar to the example of FIG. 17 except for processing performed when an operation involving great variations in the potential of the noise signal such as a modification of the size of the noise cancelling aperture 12 and turning on or off of the electron beam emitted from the electron beam source 11 is detected.

When the above-described operation is detected, the processing section 60 once undoes the results of computations of the effective value performed so far and then restarts a computation of the effective value.

Letting n be the number of data elements obtained about an effective value, when n<N, the processing section 60 uses the effective value $V_{RMS}$ in place of the DC component $V_{DC}$ of the effective value in the aforementioned division and multiplication.

When n≥N, the processing section 60 uses an average value of the most recent N data elements about an effective value as the DC component $V_{DC}$ of the effective value used for the above-described division and multiplication. The processing described so far can yield advantageous effects similar to those provided by the example illustrated in FIG. 16.

3. Others

It is to be understood that the present invention is not restricted to the foregoing embodiments and that the invention can be practiced in variously modified forms without departing from the gist of the invention.

For example, in the first embodiment, the operation for extracting the DC component $V_{DC}$ of the effective value of the output signal from the amplifier 42, a division operation on the output signal from the amplifier 32 and the output signal from the amplifier 42, and a multiplication operation between a quotient signal indicative of the result of the division and a signal indicative of the DC component $V_{DC}$ of the extracted effective value are carried out with analog circuitry. Furthermore, in the description of the second embodiment, these operations are performed by digital computations. The present invention is not restricted to this method. For instance, some of these operations may be performed with analog circuitry, while the others may be performed by digital processing.

It is to be noted that the above-described embodiments and modifications are merely exemplary and that the invention is not restricted thereto. For example, the embodiments and modifications may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An electron microscope comprising:
   an electron beam source for producing an electron beam;
   an electron beam detector for detecting a part of the electron beam;
   a DC (direct current) component extractor for extracting a DC component of an effective value of a detection signal emanating from the electron beam detector;
   an image detector for detecting a signal produced in response to impingement of the electron beam on a sample; and
   an arithmetic section for performing division on an image signal emanating from the image detector and a detection signal emanating from the electron beam detector and multiplication between a quotient signal indicative of the result of the division and the signal extracted by the DC component extractor, wherein said DC component extractor comprises:

an effective value computing section for computing said effective value;

an AC component extractor for extracting an AC component of a signal indicative of the computed effective value; and a subtractor for performing a subtraction between the signal indicative of the computed effective value and the signal extracted by said AC component extractor.

2. The electron microscope as set forth in claim 1, further comprising a processing section;

wherein said AC component extractor has a capacitor to which a signal indicative of the computed effective value is applied, a first resistor, a second resistor having a smaller resistance value than the first resistor, and switching means for switching a resistor, which is connected with the capacitor and forms a high pass filter, between the first resistor and the second resistor; and wherein said processing section performs an operation to control the switching means such that the resistor connected with the capacitor is switched from the first resistor to the second resistor when a given operation of the electron microscope is detected and an operation to control the switching means such that the resistor connected with the capacitor is switched back to the first resistor from the second resistor at the instant when a given time has passed since the switching from the first resistor to the second resistor.

3. An electron microscope comprising:

an electron beam source for producing an electron beam;

an electron beam detector for detecting a part of the electron beam;

a DC (direct current) component extractor for extracting a DC component of an effective value of a detection signal emanating from the electron beam detector;

an image detector for detecting a signal produced in response to impingement of the electron beam on a sample;

an arithmetic section for performing division on an image signal emanating from the image detector and a detection signal emanating from the electron beam detector and multiplication between a quotient signal indicative of the result of the division and the signal extracted by the DC component extractor; and a processing section for performing operations of said DC component extractor and of said arithmetic section by digital computations, wherein said processing section extracts the DC component of said effective value by computing an average value of the effective value, wherein said processing section initiates the operation of computing the average value of said effective value when a given operation of said electron microscope is detected, causes an average value of n data elements to be taken as the DC component of the effective value when the number of data elements n about the effective value is smaller than a target value N, and causes an average value of N data elements to be taken as the DC component of the effective value when the number of data elements n about the effective value is equal to or greater than the target value N.

4. A method of operating an electron microscope having an electron beam source for producing an electron beam, said method comprising the steps of:

(a) detecting a part of the electron beam to thereby produce a detection signal;

(b) extracting a DC component of an effective value of the detection signal;

(c) detecting a signal produced in response to impingement of the electron beam on a sample to thereby produce an image signal;

(d) performing a division on the image signal and the detection signal and producing a quotient signal indicative of the result of the division; and (e) performing multiplication between the quotient signal and the extracted signal wherein step (b) further includes extracting an AC component of a signal indicative of the effective value and performing subtraction between the signal indicative of the effective value and the extracted AC component.

* * * * *

UNITED STATES PATENT AND TRADEMARK OFFICE
CERTIFICATE OF CORRECTION

PATENT NO. : 10,224,176 B2
APPLICATION NO. : 15/662576
DATED : March 5, 2019
INVENTOR(S) : Takashi Suzuki It is certified that error appears in the above-identified patent and that said Letters Patent is hereby corrected as shown below:

In the Claims

Column 22, Line 35, Claim 4, after "signal" insert -- , --

Signed and Sealed this
Fourteenth Day of May, 2019

Andrei Iancu
*Director of the United States Patent and Trademark Office*